(12) United States Patent
Ichikawa et al.

(10) Patent No.: US 11,929,294 B2
(45) Date of Patent: Mar. 12, 2024

(54) COMPOSITE SUBSTRATE AND METHOD OF PRODUCING THE COMPOSITE SUBSTRATE, AND SEMICONDUCTOR DEVICE COMPRISING THE COMPOSITE SUBSTRATE

(71) Applicant: NICHIA CORPORATION, Anan (JP)

(72) Inventors: Masatsugu Ichikawa, Tokushima (JP); Shoichi Yamada, Anan (JP); Takeshi Kihara, Tokushima (JP); Yutaka Matsusaka, Anan (JP)

(73) Assignee: NICHIA CORPORATION, Anan (JP)

( * ) Notice: Subject to any disclaimer, the term of this patent is extended or adjusted under 35 U.S.C. 154(b) by 163 days.

(21) Appl. No.: 17/489,595

(22) Filed: Sep. 29, 2021

(65) Prior Publication Data

US 2022/0102229 A1 Mar. 31, 2022

(30) Foreign Application Priority Data

Sep. 30, 2020 (JP) ................... 2020-165563
Jul. 29, 2021 (JP) ................... 2021-124674

(51) Int. Cl.
*H01L 23/14* (2006.01)
*H01L 21/48* (2006.01)
*H01L 23/373* (2006.01)

(52) U.S. Cl.
CPC ........ *H01L 23/142* (2013.01); *H01L 21/4882* (2013.01); *H01L 23/3732* (2013.01); *H01L 23/3733* (2013.01); *H01L 21/4871* (2013.01); *H01L 23/3736* (2013.01)

(58) Field of Classification Search
CPC ............... H01L 23/142; H01L 21/4882; H01L 23/3732; H01L 23/3733; H01L 21/4871; H01L 23/3735; H01L 23/3736
See application file for complete search history.

(56) References Cited

U.S. PATENT DOCUMENTS

| | | | |
|---|---|---|---|
| 2010/0208431 A1* | 8/2010 | Dugas | H01L 23/3732 165/185 |
| 2016/0190417 A1 | 6/2016 | Ichikawa et al. | |
| 2016/0336253 A1 | 11/2016 | Fukui | |
| 2017/0287810 A1 | 10/2017 | Morikawa et al. | |
| 2018/0281230 A1* | 10/2018 | Ota | C22C 26/00 |
| 2018/0328677 A1 | 11/2018 | Kim et al. | |
| 2019/0051579 A1 | 2/2019 | Minoura et al. | |
| 2019/0093201 A1* | 3/2019 | Ishihara | C22C 21/02 |
| 2019/0371894 A1 | 12/2019 | Maekawa et al. | |
| 2021/0002769 A1 | 1/2021 | Goto et al. | |

FOREIGN PATENT DOCUMENTS

| | | |
|---|---|---|
| EP | 3 872 204 A1 | 9/2021 |
| JP | 2007-189171 A | 7/2007 |
| JP | 2008-248324 A | 10/2008 |

(Continued)

*Primary Examiner* — Patricia D Valenzuela
(74) *Attorney, Agent, or Firm* — Foley & Lardner LLP

(57) ABSTRACT

A composite substrate includes a base layer formed of a composite material containing diamond and a metal, the base layer a first surface, and a second surface opposite to the first surface; a flat layer having a lower surface bonded to the first surface of the base layer, and an upper surface having a surface roughness Ra of 10 nm or less; and an insulating layer directly bonded to the upper surface of the flat layer.

7 Claims, 21 Drawing Sheets

(56) References Cited

FOREIGN PATENT DOCUMENTS

| | | |
|---|---|---|
| JP | 2018-195784 A | 12/2018 |
| JP | 2019-502251 A | 1/2019 |
| JP | 2019-036566 A | 3/2019 |
| JP | 2019-091943 A | 6/2019 |
| JP | 2019-210162 A | 12/2019 |
| WO | WO-2016/035796 A1 | 3/2016 |
| WO | WO-2016/056637 A1 | 4/2016 |
| WO | WO-2019/159694 A1 | 8/2019 |
| WO | WO-2020/084903 A1 | 4/2020 |

* cited by examiner

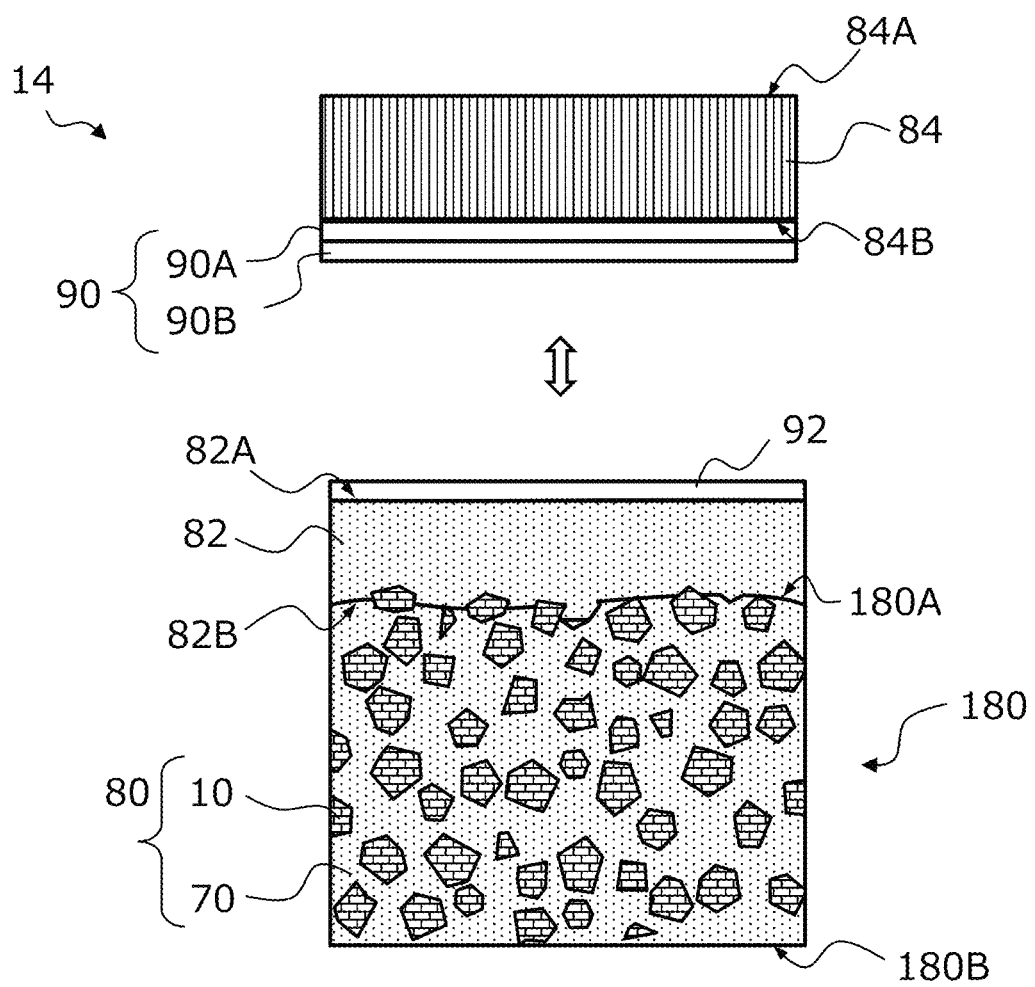

COMPOSITE SUBSTRATE AND METHOD OF PRODUCING THE COMPOSITE SUBSTRATE, AND SEMICONDUCTOR DEVICE COMPRISING THE COMPOSITE SUBSTRATE

CROSS-REFERENCE TO RELATED APPLICATIONS

This application claims priority to Japanese Patent Application No. 2020-165563, filed on Sep. 30, 2020, and Japanese Patent Application No. 2021-124674, filed on Jul. 29, 2021. The disclosures of these applications are hereby incorporated by reference in their entireties.

BACKGROUND

The present disclosure relates to a composite substrate containing diamond and a metal, a method of producing the composite substrate, and a semiconductor device comprising the composite substrate.

With an increase in the light emission power of semiconductor light emitting devices, the significance of heat dissipation from a semiconductor device has been increased. The significance of heat dissipation from a semiconductor element has been increased not only for semiconductor light emitting devices but also for semiconductor integrated circuit devices that execute computational processing at high speed, monolithic microwave integrated circuit devices that perform microwave oscillation, etc.

In order to dissipate heat from such a semiconductor device that generates heat during operation, heat dissipation members, such as a composite substrate, that dissipate heat from a semiconductor device have been studied. Heat dissipation members are demanded to have a high thermal conductivity. As a promising material for composite substrates, a composite material comprising diamond and a metal has been under development. In such a composite material, particles of diamond, which has a higher thermal conductivity than those of metals, are dispersed in a metal such as copper (Cu).

Japanese Patent Publication No. 2019-502251 describes an example of such a composite material in which diamond particles are dispersed in Cu. Japanese Patent Publication No. 2008-248324 describes a method of producing a composite material in which diamond particles are covered with a metal layer and then the diamond particles are sintered together with a Cu powder. PCT Publication No. WO 2016/056637 describes a heat dissipation substrate in which a metal layer is formed, by plating, on an alloy composite material that contains a diamond powder, a metal, and an additive powder as main components.

SUMMARY

The present disclosure provides a novel composite substrate, a method of producing the composite substrate, and a semiconductor device comprising the composite substrate.

In one example embodiment, a composite substrate includes a base layer formed of a composite material containing diamond and a metal, the base layer a first surface, and a second surface opposite to the first surface; a flat layer having a lower surface bonded to the first surface of the base layer, and an upper surface having a surface roughness Ra of 10 nm or less; and an insulating layer directly bonded to the upper surface of the flat layer.

In another embodiment, a semiconductor device includes the composite substrate described above, and a semiconductor device supported on the insulating layer of the composite substrate and electrically connected to the composite substrate.

In another embodiment, a method of producing the composite substrate includes providing a layered body, the layered body including a base layer formed of a composite material containing diamond and a metal, the base layer having a first surface and a second surface opposite to the first surface, and a flat layer having a lower surface bonded to the first surface of the base layer, and an upper surface having a surface roughness Ra of 10 nm or less; and directly bonding an insulating layer to the upper surface of the flat layer.

A novel composite substrate and a method of producing the composite substrate, and a semiconductor device comprising the composite substrate, can be provided.

BRIEF DESCRIPTION OF THE DRAWINGS

FIG. 6 is a cross-sectional view schematically showing another state before direct bonding of a composite substrate according to an embodiment of the present disclosure.

DETAILED DESCRIPTION

Prior to the description of certain embodiments of the present disclosure, the present inventors' findings and the background thereof will be described.

Figure 1:
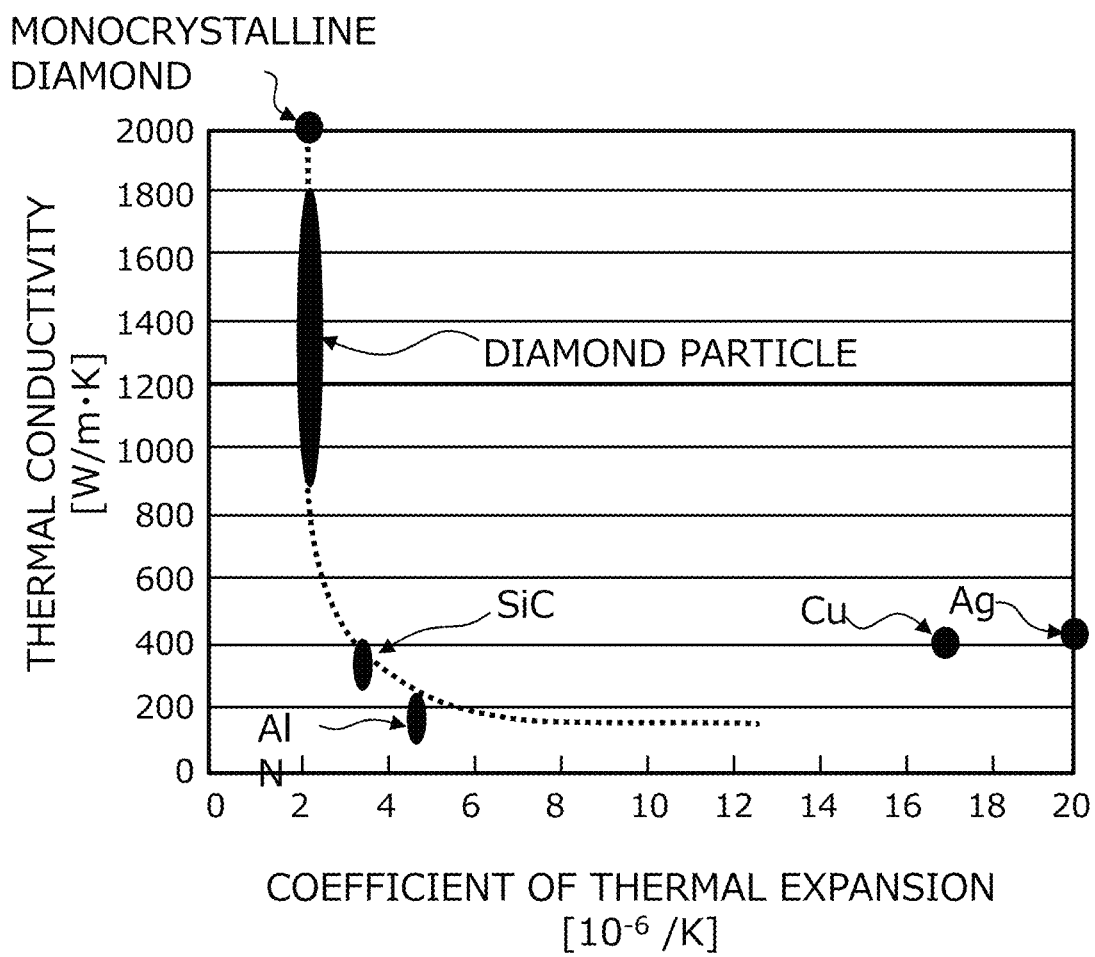
FIG. 1 is a graph in which coefficients of thermal expansion and thermal conductivities of materials such as diamond and Cu are plotted.

FIG. 1 is a graph in which coefficients of thermal expansion and thermal conductivities of materials such as diamond and Cu are plotted. In the graph, the horizontal axis represents coefficients of thermal expansion, and the vertical axis represents thermal conductivities. The term "coefficient of thermal expansion" refers to a thermal expansion per unit length, and is expressed in units of $[10^{-6}/K]$. The thermal conductivity is expressed in units of [W/m·K] (watt per meter per kelvin).

Among substances, single-crystalline diamond has the highest level of thermal conductivity, ideally exceeding 2000 [W/m·K]. Poly-crystalline diamond particles have a thermal conductivity, for example, in a range of about 900 to 1800 [W/m·K]. Diamond particles produced using CVD have a thermal conductivity, for example, in a range of about 900 to 1800 [W/m·K].

Figure 2:
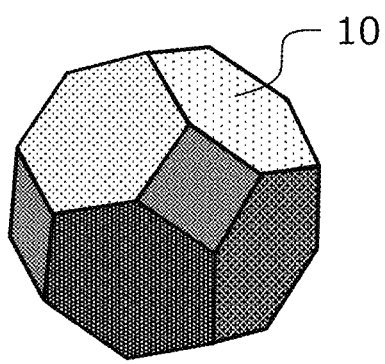
FIG. 2 is a perspective view schematically showing an example of a diamond particle.

FIG. 2 is a perspective view schematically showing an example diamond particle 10. The diamond particle 10 as shown in FIG. 2 has, for example, a polyhedral shape having hexagonal and quadrangular surfaces (facets). Actual diamond particles may have more complicated and varied shapes, e.g., additionally having other polygonal surfaces at the surface or being partially chipped. The thermal conductivities of individual diamond particles may have different values, depending on the presence of crystal defects, impurities, or the like at the surface or inside of the particle.

Cu, silver (Ag), and aluminum (Al), which are metals, have a thermal conductivity of about 400 [W/m·K], about 420 [W/m·K], and about 235 [W/m·K], respectively.

Therefore, the thermal conductivity of a composite material in which diamond particles are dispersed in a metal such as Cu has an intermediate value between the thermal conductivities of the metal and the diamond particle. The greater the volume fraction of the diamond particles contained in the composite material, the greater the theoretical value of the thermal conductivity of the composite material. However, the actual thermal conductivity of the composite material is not determined only by the volume fraction of diamond, and is thought to be affected by the state of the interface between Cu and the diamond particle. The interface between Cu and diamond may be varied, depending on defects and scratches or the like to diamond particles that may occur during a production process.

When a semiconductor device is used with a composite substrate joined thereto, then if there is a large difference in coefficient of thermal expansion between the composite substrate and a member of the semiconductor device in contact with the composite substrate, detachment or the like may occur. Therefore, it is desirable that the coefficient of thermal expansion of a composite material used in a composite substrate be similar to the coefficient of thermal expansion of a member to be joined to the composite substrate.

The composite material containing diamond particles and Cu has a thermal conductivity higher than that of Cu, and a coefficient of thermal expansion similar to that of a semiconductor, which are good characteristics. A composite material containing a metal as a matrix may be referred to as a "metal matrix composite (MMC)." Therefore, the composite material in which diamond particles are dispersed in Cu will be also herein referred to as a "Cu-diamond MMC." Alternatively, such a composite material may also be herein simply referred to as a "Cu-diamond composite material" or "composite material."

Examples of a material for the insulating layer disposed on the composite material include aluminum nitride (AlN), silicon carbide (SiC), alumina ($Al_2O_3$), silicon nitride ($Si_3N_4$), and gallium nitride (GaN). The insulating layer disposed on the composite material, which forms a portion of the composite substrate and is located on a path of heat dissipation, is preferably formed of a material having a high thermal conductivity. Examples of an insulating material having a relatively high thermal conductivity include GaN, and AlN and SiC, which are ceramics. However, there are some problems described below with bonding between the insulating layer formed of such a material and the composite material of diamond and a metal.

In general, examples of techniques for bonding two members together include bonding using an inorganic adhesive, bonding with an intermediate layer disposed between bonding surfaces of the two members, and "direct bonding" by which the two solid members are directly bonded together. In the case of bonding with an intermediate layer disposed between bonding surfaces, an intermediate layer adapted to change from the liquid phase state to the solid phase state as in, for example, brazing using a brazing metal is used. Bonding with an intermediate layer disposed between bonding surfaces may be achieved even when there are minute recesses and protrusions at the bonding surfaces of two members to be bonded together. Meanwhile, in the case of direct bonding, bonding surfaces need to have a flatness with a surface roughness (Ra) of 10 nm or less.

If the bonding surfaces of two members both have such a flatness, the two members can be bonded together at room temperature. Examples of direct bonding include surface activated bonding, atomic diffusion bonding, etc.

When a brazing metal is used, the brazing metal needs to be heated at a temperature equal to or greater than the melting point of the brazing metal. In this case, the insulating layer may be more easily detached due to a difference in coefficient of thermal expansion between the composite material and the material of the insulating layer. Meanwhile, the composite material containing diamond particles and a metal is typically formed by a sintering process, and the surface of the sintered composite material may not be flat enough for direct bonding. Furthermore, the surface and portions near the surface of such a composite material contain diamond particles, and therefore, when the composite material is subjected to grinding or polishing, diamond particles in the composite material may come off or may be broken, which may produce recesses and protrusions having a size similar to the particle size of diamond particles at the ground or polished surface. Therefore, there is difficulty in directly bonding the insulating layer of, for example, an insulating ceramic, to the polished surface of the composite material.

Certain embodiments of a composite substrate according to the present disclosure and a method of producing the composite substrate, and a semiconductor device, will be described below.

Embodiments

Figure 3:
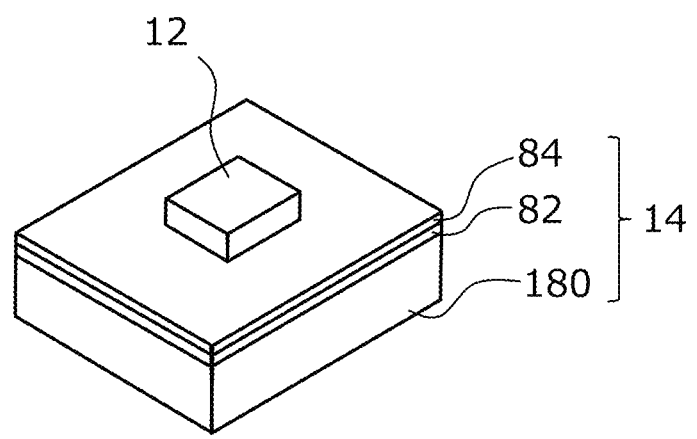
FIG. 3 is a schematic perspective view of a composite substrate according to an embodiment of the present disclosure.
Figure 4A:
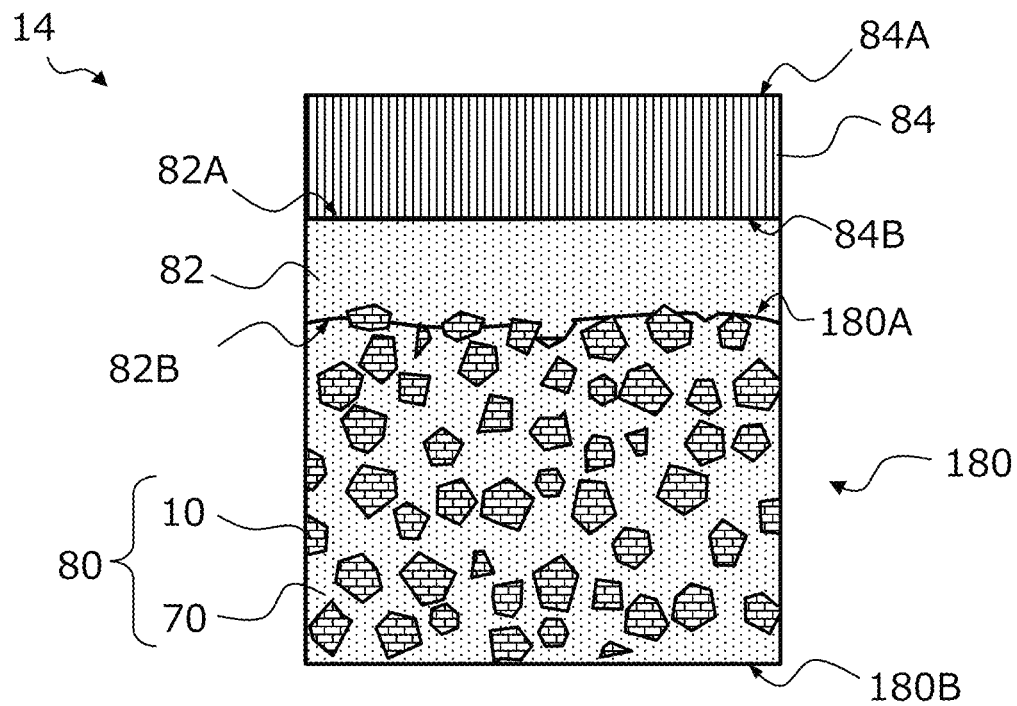
FIG. 4A is a cross-sectional view schematically showing an example configuration of a composite substrate according to an embodiment of the present disclosure.
Figure 4B:
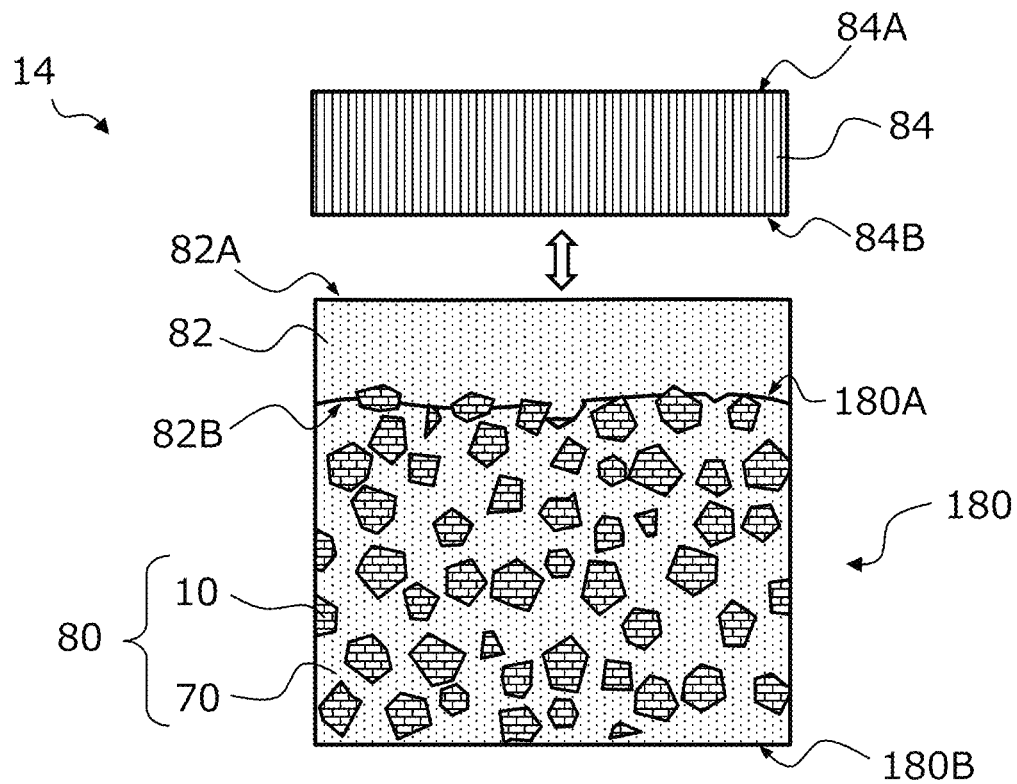
FIG. 4B is a cross-sectional view schematically showing a state before direct bonding of a composite substrate according to an embodiment of the present disclosure.

An example configuration of a composite substrate according to one embodiment of the present disclosure will be described with reference to FIG. 3, FIG. 4A, and FIG. 4B. FIG. 3 is a schematic perspective view of a composite substrate 14 and a semiconductor device 12 in one embodiment of the present disclosure. FIG. 4A is a cross-sectional view schematically showing an example configuration of the composite substrate 14. FIG. 4B is a cross-sectional view schematically showing a state before direct bonding.

As shown in FIG. 3, the composite substrate 14 includes a base layer 180, a flat layer 82, and an insulating layer (insulating member) 84. In the example of FIG. 3, the semiconductor device 12 is disposed on the insulating layer 84 of the composite substrate 14.

Referring to FIG. 4A and FIG. 4B, the base layer 180 of the composite substrate 14 is formed of a composite material 80 containing diamond particles 10 and a metal 70, and has a first surface 180A, and a second surface 180B on the opposite side from the first surface 180A. The composite material 80 included in the base layer 180 of the composite substrate 14 may have any appropriate structure, and may be produced in any appropriate method. Examples of materials preferably used for the composite material 80 include a Cu-diamond MMC, Al-diamond MMC, and Ag-diamond MMC, which have good heat conductivity. The structure and production method of the composite material 80 that may be used in one embodiment of the present disclosure will be described in detail below.

The flat layer 82 has a lower surface 82B that is bonded to the first surface 180A of the base layer 180, and an upper surface 82A that has a surface roughness Ra of 10 nm or less. The method of forming the flat layer 82 will be described in detail below. The insulating layer 84 is directly bonded to the upper surface 82A of the flat layer 82. More specifically, the insulating layer 84 has an upper surface 84A, and a lower surface 84B having a surface roughness of 10 nm or less. The lower surface 84B is directly bonded to the upper surface 82A of the flat layer 82.

In one embodiment, the flat layer 82 is formed of one or more materials selected from the group consisting of Cu, Ag, Au, Al, CuW, CuMo, AlN, SiN, and $SiO_2$.

In a certain embodiment, the flat layer 82 is formed of a material having a coefficient of thermal expansion that is at least two times the coefficient of thermal expansion of the composite material 80. Direct bonding allows the flat layer and the insulating layer to be bonded together without intentional heating even in the case in which the coefficient of thermal expansion of one of the two layers is at least two times the coefficient of thermal expansion of the other layer. Most of such materials have a high thermal conductivity, which allows for reducing reduction in thermal conductivity due to providing of the flat layer. Examples of the material having a coefficient of thermal expansion that is at least two times the coefficient of thermal expansion of the composite material include Cu, Ag, Au, and Al. The flat layer 82 has a thickness of, for example, 50 μm or greater and 1000 μm or less, preferably 50 μm or greater and 500 μm or less, and more preferably 50 μm or greater and 200 μm or less. Within these ranges, the decrease in thermal conductivity due to provision of the flat layer can be reduced.

In one embodiment, the insulating layer 84 is formed of a material having good heat conductivity. Examples of such a material for the insulating layer 84 include GaN, and AlN and SiC, which are ceramics. The insulating layer 84 has a thickness of, for example, 200 μm or less. If the insulating layer 84 is excessively thick, it is difficult for the composite substrate 14 to exhibit a heat dissipation function. If the insulating layer 84 is excessively thin, sufficient electrical insulating properties cannot be ensured. The thickness of the insulating layer 84 is less than 200 μm, preferably 150 μm or less, more preferably 100 μm or less, and particularly preferably 50 μm or less. When the thickness of the insulating layer 84 is within these ranges, decrease in the thermal conductivity of the composite substrate can be reduced. Further, the thickness of the insulating layer 84 is 5 μm or greater, which allows for ensuring electrical insulating properties. For example, in the case in which the insulating layer 84 having a thickness of 100 μm or less is required, the insulating layer 84 having such a thickness can be formed by performing polishing or the like after the composite substrate has been prepared, which allows for improving handling of the insulating layer during a production process.

Alternatively, the insulating layer 84 having the desired thickness may be provided before being direly bonded to the flat layer.

The "direct bonding" may be performed in any appropriate manner. For example, either surface activated bonding or atomic diffusion bonding can be used. In surface activated bonding, bonding surfaces are cleaned in a vacuum to turn into active surface conditions, and are then bonded together. The cleaning of bonding surfaces is performed by, for example, irradiation with ion beams. In atomic diffusion bonding, for example, a metal layer having a thickness of 1 nm or greater and 500 nm or less is formed on each bonding surface, and thereafter, the bonding surfaces are brought into contact with each other in a vacuum or in an inert gas, which allows metal atoms to be mutually diffused and directly bind to each other. Before bringing the bonding surfaces into contact with each other, argon plasma, ion beams, or atom beams may be irradiated in a vacuum to clean and activate the bonding surfaces. With direct bonding in such a manner, a firm bond between bonding surfaces can be achieved by bond between atoms without using a bonding member such as an adhesive. Therefore, decrease in heat conductivity at bonding surfaces can be reduced.

With atomic diffusion bonding, direct bonding can be achieved at a highest temperature reached by heat generated by the semiconductor device 12 in thermal contact with the composite substrate 14, such as about 200° C. or lower, which is a relatively low temperature. However, when direct bonding is performed at such a temperature, bonding surfaces need to have a surface roughness (Ra) of 10 nm or less, preferably 5 nm or less, and particularly preferably 1 nm or less. Such direct bonding that can be performed at a relatively low temperature does not require a high-temperature environment in bonding of the flat layer 82 and the insulating layer 84, so that the bonding interface between bonding surfaces is less affected by stress caused due to the difference in coefficient of thermal expansion therebetween, resulting in a high bonding strength. This indicates that materials that have a relatively large difference in coefficient of thermal expansion may be selected for the flat layer 82 and the insulating layer 84, resulting in greater freedom in choosing the materials. More specifically, when the insulating layer 84 is formed of AlN, which is a ceramic having a high heat conductivity, the flat layer 82 can be formed of Cu, Ag, Au, or Al, which has a coefficient of thermal expansion that is at least two times the coefficient of thermal expansion of AlN, according to one embodiment of the present disclosure.

Figure 5:
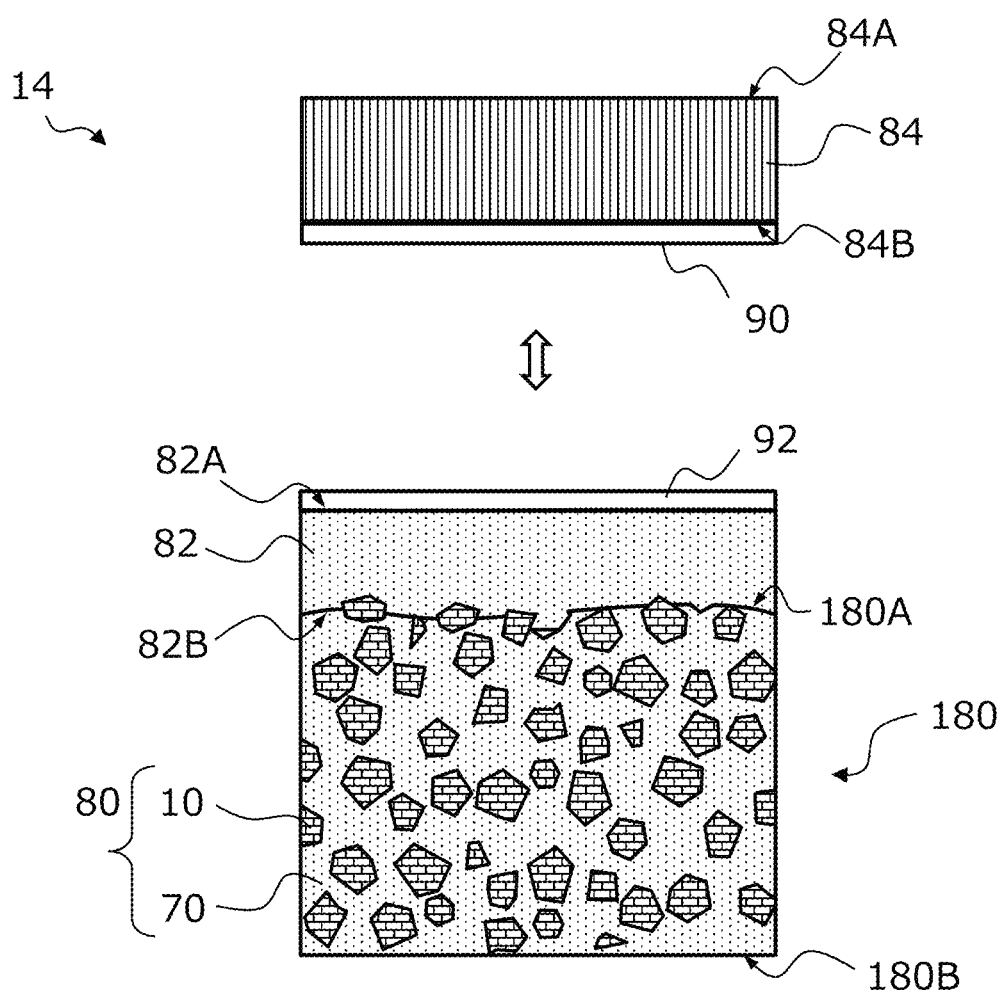
FIG. 5 is a cross-sectional view schematically showing another state before direct bonding of a composite substrate according to an embodiment of the present disclosure.

Next, an example of steps of direct bonding will be described with reference to FIG. 5. In the example herein, an embodiment in which atomic diffusion bonding is used as direct bonding will be described. In the example of FIG. 5, a metal layer 90 is disposed on the lower surface 84B of the insulating layer 84. Likewise, a metal layer 92 is disposed on the upper surface 82A of the flat layer 82. The metal layers 90 and 92 may be formed of any appropriate metal material, preferably the metal Ti, Al, Au, Cu, or Ta or an alloy thereof. The metal layers 90 and 92 may be formed on the lower surface 84B of the insulating layer 84 and the upper surface 82A of the flat layer 82, respectively, by vacuum vapor deposition, sputtering, or the like. The metal layers 90 and 92 have a thickness of, for example, 1 nm or greater and 500 nm or less.

Each of the metal layers 90 and 92 has a flat surface whose flatness is attributed to the flatness of the underlying metal layer and insulating layer. During direct bonding, atoms are mutually diffused between the metal layers 90 and 92 that are in contact with each other, and bind to each other, even at, for example, 200° C. or lower, 50° C. or lower, or 40° C. or lower. In order to achieve such room-temperature bonding, the surfaces of the metal layers 90 and 92 need to be maintained clean during a period of time from immediately after formation to the start of direct bonding. Therefore, the step of forming the metal layers 90 and 92 and the subsequent direct bonding are preferably continuously performed in a vacuum chamber isolated from the atmosphere. When Au is used as a material for the metal layers 90 and 92, bonding may be performed in the atmosphere. Au is a relatively stable metal, and thus a native oxide film is not easily formed on the surface even in the atmosphere. Even when a native oxide film has been formed on a the Au surface, performing bonding with heating at 200° C. or lower, which is a relatively low temperature for semiconductor processes, can cause removal of the native oxide film and bonding. Thus, using Au allows for facilitating handling.

Next, another example of the direct bonding step will be described with reference to FIG. 6. In the example of FIG. 6, a metal layer 90 disposed on the lower surface 84B of the insulating layer 84 includes a layered structure in which a first metal layer 90A and a second metal layer 90B are layered. A metal layer 92 is disposed on the upper surface 82A of the flat layer 82. In the case in which the insulating layer 84 is formed of a sintered body of a ceramic or the like, the lower surface 84B may have minute recesses and protrusions. When the metal layer 90 has a multilayer structure, a technique that allows for improving the surface flatness of the metal layer 90 can be used. For example, sputtering film formation in combination with ion etching, or chemical-mechanical polishing (CMP) can be used. The first metal layer 90A is preferably formed of, for example, Ti and Cu. Cu has good heat conductivity, and Ti has good adhesion to Cu and a sintered body of AlN or the like. Similarly to the metal layer 90, the metal layer 92 may have a multilayer structure.

In one embodiment of the present disclosure, the flat layer 82 has an important role in achieving the direct bonding described above. In the present embodiment, the flat layer 82 is formed of a metal material such as Cu as described above, and the flat layer 82 and the composite material 80 are bonded together by sintering. In the description above, a structure including the composite material 80 and the flat layer 82 are directly bonded to the insulating layer 84 using atomic diffusion bonding. For this direct bonding, surface activated bonding can be used. More specifically, the surface roughness of each of the upper surface 82A of the flat layer 82 and the lower surface 84B of the insulating layer 84, which are bonding surfaces, is set to 10 nm or less, and these bonding surfaces are cleaned in a vacuum using ion beams. By causing the cleaned bonding surfaces to overlay on each other in a vacuum, the composite substrate 14 can be obtained.

One embodiment of a method of producing the composite substrate of the present disclosure will be described below.

Figure 7A:
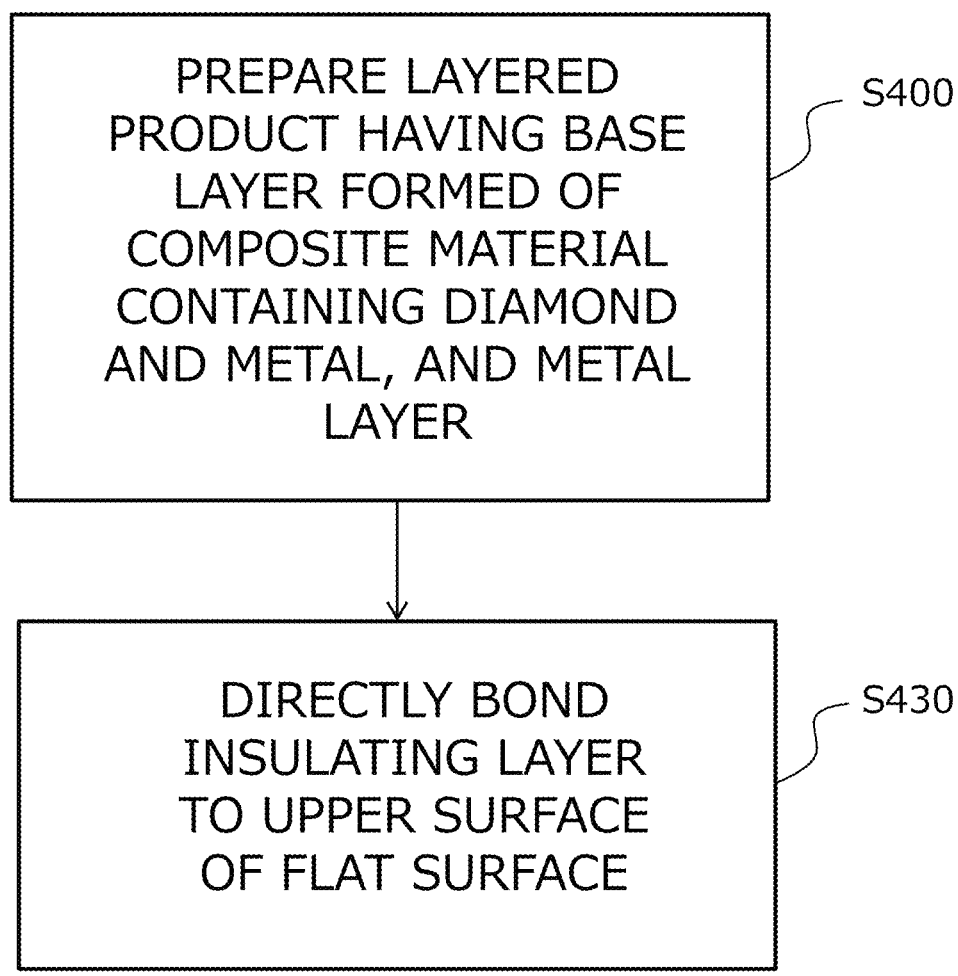
FIG. 7A is a flowchart showing main steps in a method of producing a composite substrate according to an embodiment of the present disclosure.

Reference is made to FIG. 7A. FIG. 7A is a flowchart showing main steps in a method of producing a composite substrate according to one embodiment of the present disclosure. The method of producing the composite substrate in this embodiment includes a step S400 of preparing a layered body that has a base layer formed of a composite material containing diamond and a metal, and having a first surface and a second surface on the opposite side from the first surface, and a flat layer having a lower surface, bonded to the first surface of the base layer, and an upper surface having a surface roughness Ra of 10 nm or less. The flat layer is bonded to the first surface of the base layer by sintering. A specific example of the method of producing such a layered body will be described below. Next, a step S430 of directly bonding an insulating layer to the upper surface of the flat layer is performed. In the step of preparing the layered body, a surface of a metal layer in the layered body may be polished to obtain the flat layer having an upper surface having a surface roughness Ra of 10 nm or less.

Figure 7B:
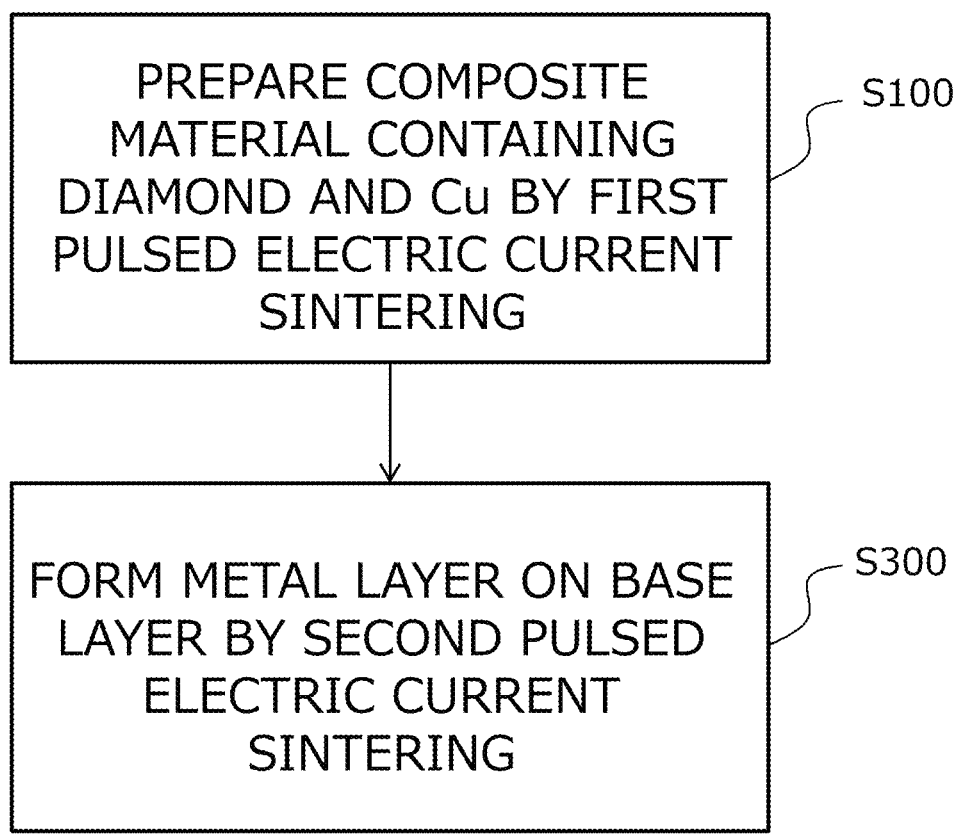
FIG. 7B is a flowchart showing an example of a step of preparing a layered body in an embodiment of the present disclosure.

Next, an example of the step of preparing the layered body having the base layer of the composite material and the metal layer will be described with reference to FIG. 7B. FIG. 7B is a flowchart showing a step of preparing the layered body in one embodiment of the present disclosure. As shown in FIG. 7B, the step of preparing the layered body includes a step S100 of preparing a composite material containing diamond and Cu by first pulsed electric current sintering, and a step S300 of forming a metal layer on the base layer by second pulsed electric current sintering. Pulsed electric current sintering will be described in detail below.

Figure 7C:
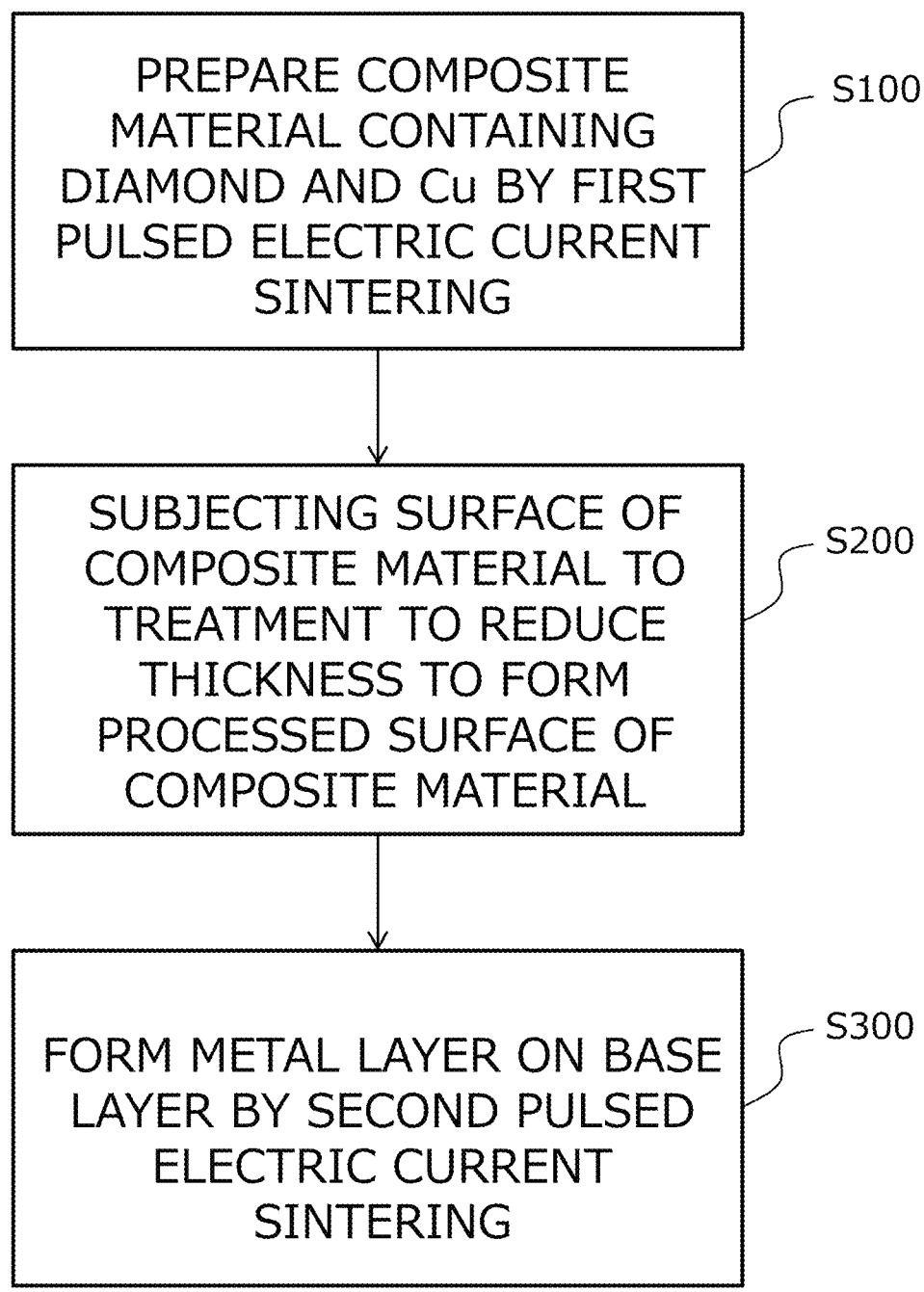
FIG. 7C is a flowchart showing another example of the step of preparing a layered body in an embodiment of the present disclosure.

The layered body can be prepared in a manner other than the example described above. FIG. 7C is a flowchart showing another example of the step of preparing the layered body. As shown in FIG. 7C, the step of preparing the layered body in this example includes a step S100 of preparing a composite material containing diamond and Cu by first pulsed electric current sintering, a step S200 of subjecting the composite material to a treatment to reduce thickness to form a processed surface of the composite material, and a step S300 of forming a metal layer on the base layer by second pulsed electric current sintering.

The pulsed electric current sintering performed after the polishing step may also be hereinafter referred to as "second pulsed electric current sintering" in order to distinguish this pulsed electric current sintering from that used for producing the composite material.

Figure 7D:
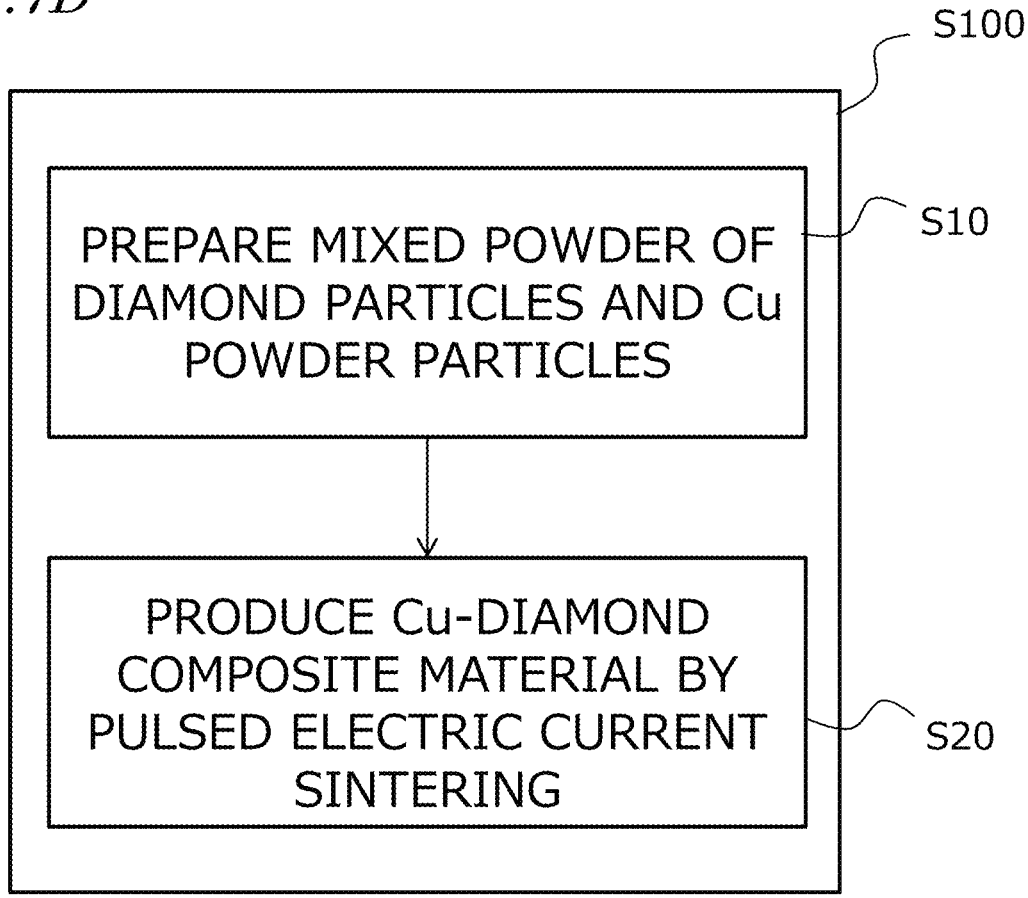
FIG. 7D is a flowchart showing a step of producing a base layer of a Cu-diamond composite material in an embodiment of the present disclosure.

The step S100 of providing the base layer made of the composite material of the present embodiment will be described in detail below. FIG. 7D is a flowchart showing a specific example of the step S100 of providing the composite material according to this embodiment. In the present embodiment, various composite materials produced by known techniques can be used. For example, commercially available composite materials may be used. Examples of the technique of producing the composite material include a sintering technique and a melting technique. Techniques preferable for producing the composite material include pulsed electric current sintering. Using this technique allows for obtaining the composite material under relatively low-temperature conditions compared to conventional techniques, as described below.

As shown in FIG. 7D, the step S100 includes a step S10 of providing a mixed powder of diamond particles and Cu powder particles, and a step S20 of performing pulsed electric current sintering with a pressure applied to the mixed powder and the temperature of the mixed powder maintained equal to or higher than 500° C. and lower than 800° C. to obtain a composite material comprising diamond and Cu from the mixed powder. The "temperature" as used herein refers to a temperature as measured directly or indirectly by, for example, a temperature measurement device, such as a radiation thermometer or thermocouple. In the present disclosure, the "temperature" refers to the value of a temperature as measured at a die 30 of a sintering device shown in FIG. 9 described below. A "sintering peak temperature Ts" in the description below refers to a temperature that is maintained at a predetermined pressure for a total of 1 minute or more, of the temperatures of the die 30 as measured by a radiation thermometer or thermocouple. For example, in the case of FIG. 10, the highest temperature that is maintained during the holding in the sintering is referred to as a sintering peak temperature Ts, so as to be distinguished from transient temperatures during a temperature rise period and a temperature fall period.

Figure 8:
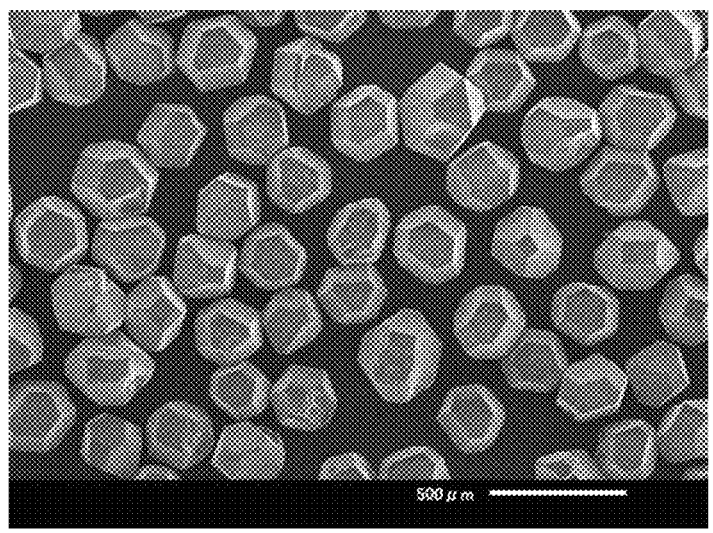
FIG. 8 is a photograph showing an example of diamond particles contained in a mixed powder in an embodiment of the present disclosure.

FIG. 8 is a photograph showing an example of the diamond particles contained in the mixed powder in the step S10. In one embodiment, the diamond particles have an average particle size of 40 μm or greater and 500 μm or less. The particle size distribution of the diamond particles does not need to be a single-peak distribution having a single peak, and may have a plurality of peaks. With the average particle size of the diamond particles of 40 μm or more, the Cu-diamond MMC can be produced at low cost, and the thermal conductivity of the Cu-diamond MMC can be increased. With the average particle size of the diamond particles of 500 μm or less, the manufacturing cost of the diamond particles can be reduced. The particle size distribution of the diamond particles is preferably 200 μm or greater and 400 μm or less. Within this range, the thermal conductivity can be further improved. In one embodiment, the diamond particles in the mixed powder may include particles having an average particle size of 200 μm or greater and 500 μm or less, and particles having an average particle size of 40 μm or greater and 80 μm or less. In the present specification, particles having an average particle size of 200 μm or greater and 500 μm or less will be referred to as "large particles," and particles having an average particle size of 40 μm or greater and 80 μm or less will be referred to as "small particles."

Particles having a relatively small average particle size can be dispersed to fill gaps between particles having a relatively large average particle size. Therefore, the contained amount of diamond, which has a higher thermal conductivity than that of Cu, can be increased. This allows for further improving the thermal conductivity of the Cu-diamond MMC. In the present specification, such a mixed powder having bimodality in a particle size distribution will be referred to as a "bimodal mixed powder." In a bimodal mixed powder, the proportion (mass fraction) of particles having an average particle size of 200 μm or greater and 400 μm or less to all of the diamond particles is preferably 50% or more. This is because the greater the proportion of particles having a larger average particle size, the smaller the total surface area of the diamond particles, and therefore, the smaller the contribution of thermal resistance at the interface between the diamond particle and Cu.

The average particle size of the Cu powder particles is, for example, 3 μm or greater and 10 μm or less. The Cu powder particles may contain a Cu fine powder having a particle size of 1 μm or less, which may be generated due to pulverization or the like. The Cu powder particle may contain inevitable impurities. However, it is desirable that impurities such as oxygen and nitrogen are removed as much as possible, because such impurities lead to a reduction in thermal conductivity. The amount of impurities contained in the Cu powder particle is preferably 2 mass % or less. Cu powder particles produced using a known method or that are commercially available may be used for such Cu powder particles.

The "average particle size" as used in the present disclosure refers to a "median diameter" in a particle size distribution as measured by a laser diffraction particle size distribution measurement device.

In embodiments of the present disclosure, a metal other than Cu powder particles aiming to enhance wettability between Cu and diamond is intentionally not added.

Because of poor wettability between Cu and diamond, it has been thought that the wettability needs to be improved by adding such a metal.

However, in embodiments of the present disclosure, such an addition of a metal is not required. By intentionally avoiding adding a metal other than the Cu powder particles, inhibition of sintering can be reduced. In one embodiment, the added amount of a metal or metals other than Cu in the mixed powder, expressed in mass fraction, is 1% or less.

In order to, for example, improve the degree of adhesion between the diamond particles and the Cu powder particles, the individual diamond particles may be covered with a metal layer of Cu or the like as described above. However, in some embodiments of the present disclosure, the diamond particles are not covered with a metal layer. When the diamond particles are not covered with a metal layer of Cu or the like, sintering activity can be enhanced compared to the case in which the diamond particles are covered with a metal layer of Cu or the like. If the diamond particles are covered with a metal layer of Cu or the like, the sintering activity may decrease, and thus firing needs to be conducted at a high temperature as in the case in which a metal is added.

In the present embodiment, the mass fraction of the Cu powder particles in the mixed powder is preferably for example, 60% or greater and 85% or less, and the mass fraction of the diamond particles in the mixed powder is preferably for example, 15% or greater and 40% or less. In other words, the mass ratio of the Cu powder particles and the diamond particles is selected within the range of 60:40 to 85:15, and is, for example, 80:20. The greater the mass fraction of the diamond particles, the greater the thermal conductivity of the composite material. With the mass fraction of the Cu powder particles of 60% or greater and 85% or less, a sufficient amount of Cu is dispersed around diamond, and therefore, spaces or gaps that impede heat conduction are less likely to be generated in the Cu-diamond MMC. In other words, if the mass fraction of the Cu powder particles is within the range described above, Cu can have a volume that allows a sufficient amount of Cu to be dispersed around diamond, which can facilitate effectively filling a space between diamond particles with Cu. Because the thermal conductivity of Cu is lower than the thermal conductivity of diamond, excessively high mass fraction of Cu may result in reduction in thermal conductivity of the Cu-diamond MMC. With the mass fraction of the Cu powder particles within the range described above, the Cu-diamond MMC can have a high thermal conductivity. In addition, as will be described below, experiments conducted by the present inventors demonstrated that even if the mass fraction of the diamond particles is the same, a higher thermal conductivity is likely to be obtained using a bimodal mixed powder.

Figure 9:
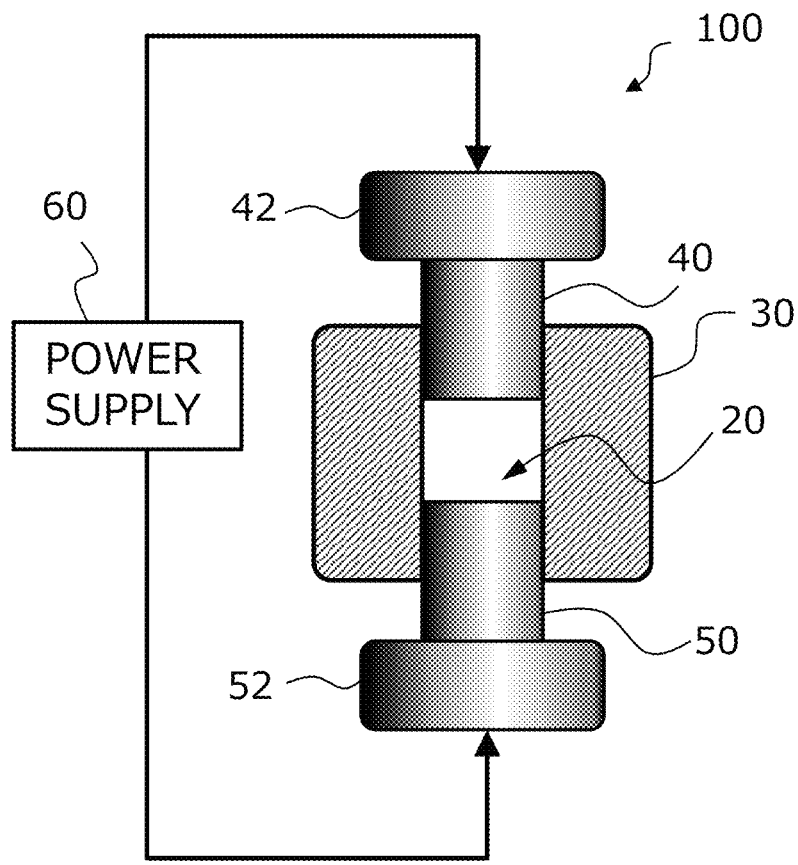
FIG. 9 is a schematic diagram showing an example configuration of a sintering device for use in pulsed electric current sintering in an embodiment of the present disclosure.

In the step S20, pulsed electric current sintering may be performed using, for example, a sintering device 100 shown in FIG. 9. Pulsed electric current sintering is also called "spark plasma sintering (SPS)". Therefore, the sintering device 100 of FIG. 9 will also be referred to as an "SPS device." The sintering device 100 in FIG. 9 has a die 30 that defines a through hole forming a cavity 20, and an upper punch 40 and a lower punch 50 that are configured to be moved relatively upward and downward along the through hole of the die 30. The sintering device 100 in this example can perform sintering by utilizing self-heating under vertical uniaxial pressure. The upper punch 40 is electrically connected to a first electrode 51, and the lower punch 50 is electrically connected to a second electrode 52. The first electrode 51 and the second electrode 52 are electrically connected to a power supply unit 60.

The die 30 may be formed of a material having good heat resistance, such as graphite. The upper punch 40 and the lower punch 50 may be formed of a material having electrical conductivity and heat resistance, such as graphite. In measurement of thermal conductivity, the flatter the specimen, the higher the reliability of measurement of thermal diffusivity. Therefore, in the case in which it is difficult to ensure the flatness of a produced sintered body, a hard material is preferably inserted between the upper punch 40 and the specimen and between the lower punch 50 and the specimen so as to allow the sintered body to have flat surfaces. The hard material is preferably a cemented carbide, such as tungsten carbide (WC) or titanium carbide (TiC). The material for the upper punch 40 and the lower punch 50 may be changed to a hard material. The cavity 20 is a space defined by an inner wall surface defining the through hole of the die 30, a lower end surface of the upper punch 40, and an upper end surface of the lower punch 50. The mixed powder described above is placed in the inside of the cavity 20. Vertical movement of at least one of the upper punch 40 and the lower punch 50 reduces the space between the upper punch 40 and the lower punch 50, so that a pressure is applied to the mixed powder in the cavity 20. The upper punch 40 and the lower punch 50 are driven by, for example, a hydraulic device (not shown). The pressure applied to the mixed powder in the cavity 20 may be adjusted to an appropriate value within the range of, for example, 5 MPa or greater and 100 MPa or less.

In pulsed electric current sintering, a pulsed electric current is applied between the upper punch 40 and the lower punch 50 by the sintering device 100 with a pressure applied to the mixed powder. The passage of a pulsed electric current is performed by repeatedly causing a pulsed DC current from the power supply unit 60 to flow between the first electrode 51 and the second electrode 52. In the mixed powder pressurized by the upper punch 40 and the lower punch 50, Cu powder particles are in contact with each other, and therefore, a large number of local current paths are formed in the mixed powder, which allows the passage of an electric current. Such passage of a pulsed electric current generates Joule heat, which causes the temperature of the mixed powder to increase to a predetermined sintering temperature.

Figure 10:
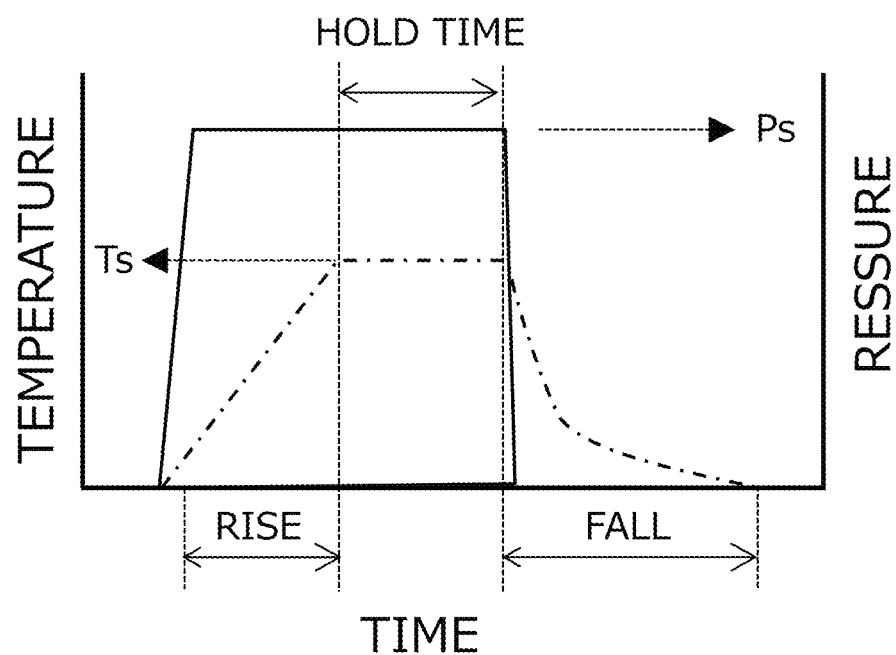
FIG. 10 is a diagram schematically showing an example of relationship between an elapsed time from the start to the end of a pulsed electric current sintering step, and a temperature and pressure of a mixed powder.

FIG. 10 is a diagram schematically showing an example of change in the temperature and pressure of the mixed powder with time during a period of time from the start to end of the pulsed electric current sintering step. The temperature is indicated by a dash-dot line, and the pressure is indicated by a solid line. The horizontal axis represents time, the left vertical axis represents temperature, and the right vertical axis represents pressure. With the movement of the upper punch 40 and/or the lower punch 50, the pressure reaches a sintering pressure Ps in, for example, several seconds, and the sintering pressure Ps is maintained for, for example, 60 to 1800 seconds. After the start of passage of a pulsed electric current, the temperature of the mixed powder increases at a rate of, for example, 10 to 150 [° C./min] or more. After the temperature has reached a predetermined sintering peak temperature Ts, the voltage application conditions for the passage of a pulsed electric current are adjusted so as to maintain the sintering peak temperature Ts within the range of ±5° C. from a target temperature. The control of the sintering temperature can be performed through measurement feedback from a temperature measurement device attached to the die 30 of FIG. 9.

After a predetermined sintering time (i.e., a hold time) has passed and thus a composite material has been produced from the mixed powder, the passage of a pulsed electric current is stopped, so that the temperature starts decreasing. In addition, the upper punch 40 and/or the lower punch 50 are moved to stop the application of a pressure to the composite material. After the temperature of the composite material has been sufficiently cooled to, for example, equal to or lower than 50° C., the composite material is taken out from the die 30.

FIG. 10 shows that the temperature and pressure increase and plateau linearly with time, for the sake of simplicity. The transition in the actual temperature and pressure may include slight overshoots, curved changes, small fluctuations, and the like.

In the present embodiment, in order to maintain the sintering temperature, the voltage is adjusted within the range of 1.0 V or greater and 3.0 V or less, and the pulsed electric current is adjusted within the range of 400 A or greater and 800 A or less. The pulsed electric current has a duty ratio in a range of, for example, 10 to 80%, and a pulse width in a range of, for example, 1 to 500 milliseconds. After the predetermined sintering peak temperature Ts has been maintained for a predetermined period of time, the application of the pulsed electric current is stopped. These values are varied depending on various conditions such as the weight of the mixed powder, the sintering temperature, the material for the punches, etc., and therefore, are not limited to the ranges described above and can be changed if necessary.

In the case in which the sintering temperature is set to, for example, 600° C., the time it takes to reach from room temperature to the sintering temperature is, for example, several minutes to about 20 minutes. The cavity 20 is located in a reduced-pressure chamber. The ambient pressure in the reduced-pressure chamber is, for example, 100 Pa or less. Thus, the powder particles can be substantially prevented from being oxidized or nitrided during the step of sintering by the passage of a pulsed electric current.

The sintering peak temperature Ts in an embodiment of the present disclosure is equal to or higher than 500° C. and lower than 800° C. as described above. Within this range, a Cu-diamond MMC having good thermal conductivity can be produced. The sintering peak temperature Ts is preferably 500° C. or greater and 750° C. or less, more preferably 550° C. or greater and 700° C. or less, and particularly preferably 600° C. or greater and 700° C. or less. Within these ranges, a Cu-diamond MMC having better thermal conductivity can be obtained. The sintering time, which also depends on the sintering peak temperature Ts, is, for example, 1 minute or more and 30 minutes or less. In the case in which the sintering peak temperature Ts is, for example, 550° C. or greater and 650° C. or less, the sintering time may be 5 minutes or more and 20 minutes or less, e.g., about 10 minutes.

The pressure applied to the mixed powder at the sintering peak temperature Ts is 5 MPa or more and 100 MPa or less, provided that the pressure is maintained constant. With the applied pressure of 5 MPa or more and 100 MPa or less, a Cu-diamond MMC having good thermal conductivity can be produced. The range of pressure to be applied is preferably 10 MPa or greater and 90 MPa or less, more preferably 20 MPa or greater and 90 MPa or less, even more preferably 25 MPa or greater and 75 MPa or less, and particularly preferably 25 MPa or greater and 50 MPa or less. Within these pressure ranges, a Cu-diamond MMC having good thermal conductivity can be produced. In the present specification, applying a constant pressure at the sintering peak temperature Ts as described above will be referred to as "continuous pressurization."

Although an example in which continuous pressurization is used has been described above, the pressure does not need to be constant. The applied pressure may be increased or decreased in a stepwise or continuous manner, depending on processing of sintering. A first pressure and a second pressure higher than the first pressure may be repeatedly applied to the mixed powder while the passage of a pulsed electric current is performed. Such a pressurization mode will be referred to as "cyclic pressurization." By the cyclic pressurization, in which a first pressure and a second pressure higher than the first pressure are repeatedly applied, a Cu-diamond MMC having a high thermal conductivity can be produced. This is thought to be attributed to, for example, a mechanism described as follows.

There is a difference in absolute value between the first pressure and the second pressure. In repetitive application of the first and second pressures, the first pressure is applied after the second pressure is applied. At this time, the relatively high pressure and then the relatively low pressure are applied, and therefore, the degree of freedom of the diamond particles in the die is higher when the first pressure is applied than when the second pressure is applied. This is thought to allow the arrangement of the diamond particles or the state of the interface between Cu and the diamond particles to be more advantageous in terms of heat conduction. It is also likely that oxygen that is present in the surface of Cu and impedes heat conduction is removed. This is thought to result in improvement in the thermal diffusivity of a Cu-diamond MMC produced by cyclic pressurization compared to the case in which only the first pressure is applied, which increase thermal conductivity.

The first and second pressures applied to the mixture of the diamond particles and the Cu powder particles may be set within the range of 5 MPa or greater and 100 MPa or less, such that the second pressure is greater than the first pressure. For example, the first pressure may be 5 MPa or greater and 60 MPa or less, and the second pressure may be 20 MPa or greater and 100 MPa or less. It is preferable that the first pressure is equal to or more than 5 MPa and less than 20 MPa, and the second pressure may be equal to or more than 20 and equal to or less than 40 MPa. With the first and second pressures within the above respective ranges, the thermal conductivity can be further improved.

Figure 11A:
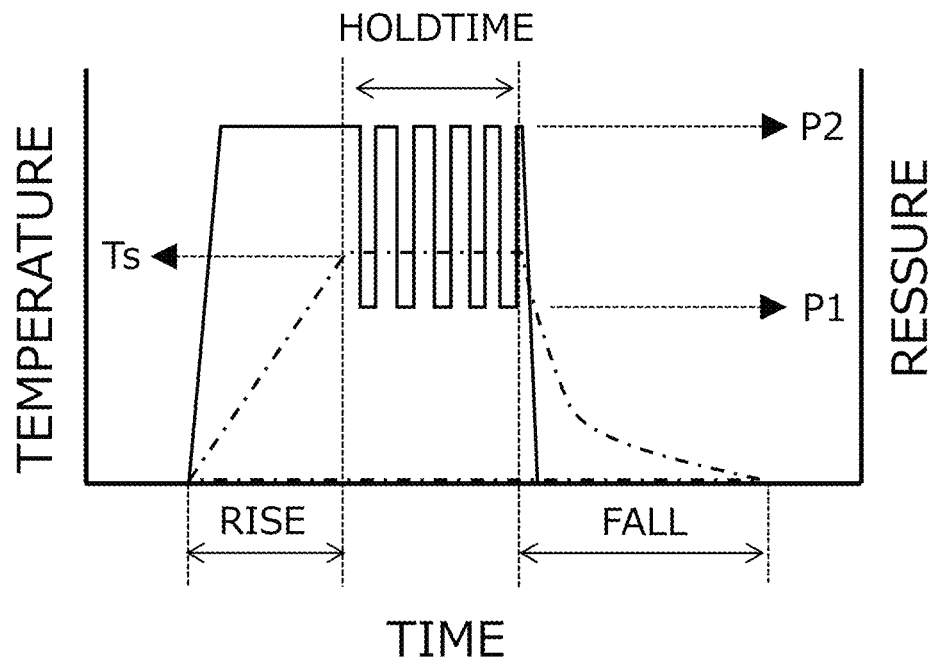
FIG. 11A is a diagram schematically showing another example of the relationship between an elapsed time from the start to the end of a pulsed electric current sintering step, and a temperature and pressure of a mixed powder.

FIG. 11A is a diagram showing an example of the "cyclic pressurization" during sintering. In this example, during the sintering time, a first pressure P1 and a second pressure P2 higher than the first pressure P1 are repeatedly applied to the mixed powder. In one example, in the case in which the first pressure P1 is 10 MPa and the second pressure P2 is 40 MPa, for example, 10-50 cycles of pressure application are performed in the sintering step, where in each cycle, the first pressure P1 is applied for 10 seconds, and thereafter, the second pressure P2 is applied for 20 seconds. As will be described below, by varying the pressure during the sintering time, a denser composite material is obtained, i.e., the relative density thereof is increased. This contributes to increase in the thermal conductivity of the composite material.

Figure 11B:
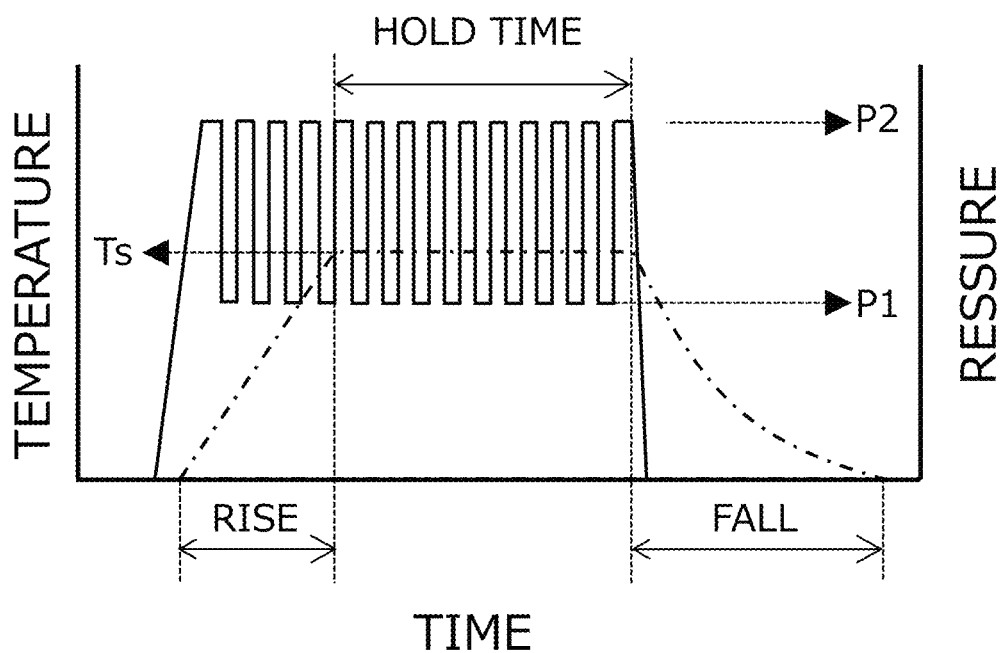
FIG. 11B is a diagram schematically showing another example of the relationship between an elapsed time from the start to the end of a pulsed electric current sintering step, and a temperature and pressure of a mixed powder.

FIG. 11B is a diagram showing another example of the "cyclic pressurization" during sintering. As shown in FIG. 11B, the first pressure and the second pressure higher than the first pressure may be repeatedly applied to the mixed powder during temperature rise period, and then during maintaining the sintering peak temperature Ts.

Figure 12:
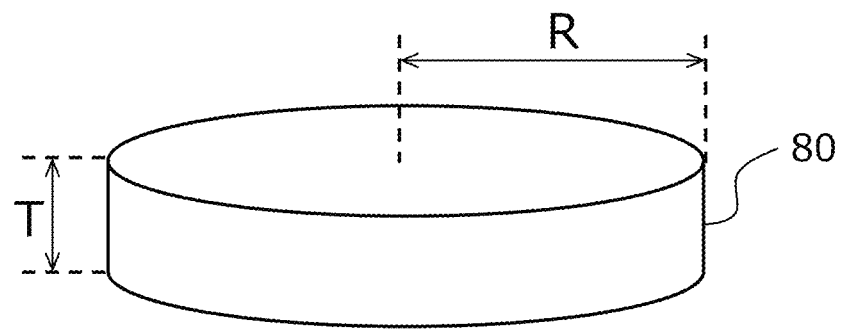
FIG. 12 is a perspective view schematically showing an outer shape of a composite material produced according to an embodiment of the present disclosure.

FIG. 12 is a perspective view schematically showing an example outer shape of the composite material 80 produced according to the present embodiment. In this example, the composite material 80 is in a disc-like shape having a thickness of T [mm] and a radius of R [mm]. The thickness T is, for example, 0.2 mm or greater and 20.0 mm or less. The radius R is, for example, 3 mm or greater and 200 mm or less. The composite material 80 immediately after sintering may not have a disc-like shape, and may be in a cuboid shape or other polyhydric shape, or may have stripe grooves or a regular pattern of protrusions and recesses in a surface thereof. A shape of the composite material 80 immediately after sintering when viewed from above is defined by the shape of a cross-section thereof taken in an axial direction perpendicular to the cavity 20 of FIG. 9. For example, in the case in which the die 30 of FIG. 9 defines a prism-shaped through hole, and the lower end surface of the upper punch 40 and the upper end surface of the lower punch 50 are flat rectangular surfaces, the composite material 80 taken out from the sintering device 100 may be in a rectangular thin plate shape in a top view. After being taken out from the sintering device 100, the composite material 80 may be subjected to various types of processing, including mechanical processing, such as cutting and polishing, or laser processing. A single the composite material 80 may be singulated into a plurality of individual heat dissipation members.

Figure 13:
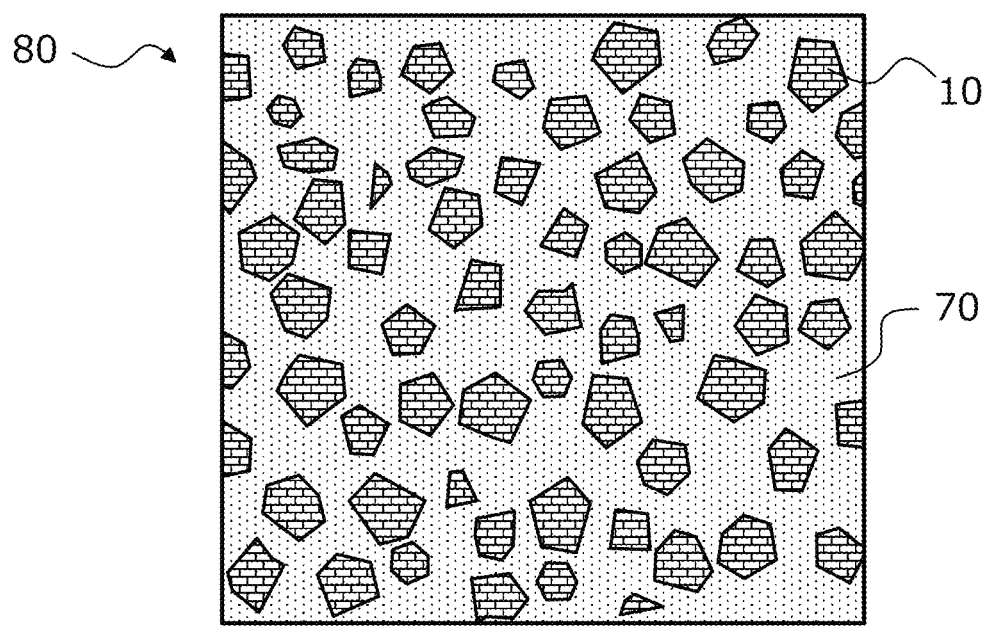
FIG. 13 is an enlarged cross-sectional view schematically showing a portion of a composite material produced according to an embodiment of the present disclosure.

FIG. 13 is a schematic enlarged view showing a portion of a cross-section of the composite material 80 produced in such a manner. FIG. 13 is based on cross-sectional observation using an optical microscope or scanning electron microscope (SEM). The composite material 80 shown in FIG. 13 contains Cu 70 as a metal matrix, and a large number of diamond particles 10 dispersed in the Cu 70. The Cu 70 is a metal body in which the Cu powder particles included in the mixed powder are sintered to be integrated together by the passage of a pulsed electric current. The individual diamond particles 10 contained in the composite material 80 have been contained in the mixed powder. While the diamond particles 10 may be partially chipped in the pulsed electric current sintering step, a plurality of diamond particles are not joined together to grow into a new single particle.

According to the embodiment described above, a Cu-diamond composite material can be produced at a low temperature and under a low pressure compared to conventional techniques, so that a Cu-diamond composite material having a thermal conductivity of, for example, 460 [W/m·K] or more can be obtained. Furthermore, a composite material having a thermal conductivity of 500 [W/m·K] or more can be obtained. Furthermore, a composite material having a thermal conductivity of 600 [W/m·K], preferably 690 to 710 [W/m·K] or more, can be obtained. This is thought to be attributed to that setting the sintering temperature and pressure to be lower than those that are conventionally thought to be necessary allows for reducing or avoiding a degradation in thermal conductivity of diamond particles or a Cu-diamond interface that may occur during high-temperature and high-pressure sintering.

In the embodiment described above, during the process of cooling the Cu-diamond MMC to room temperature after pulsed electric current sintering, the amount of expansion and contraction of each of Cu and diamond depending on a difference in coefficient of thermal expansion therebetween is small. Thus, Cu and diamond are less likely to be separated from each other due to the difference in coefficient of thermal expansion, so that a decrease in thermal conductivity can be reduced.

Referring again to FIG. 7C, a step S200 will be described. In the step S200, the Cu-diamond composite material is subjected to a treatment to reduce a thickness thereof. The treatment to reduce a thickness of the Cu-diamond composite material includes polishing and laser processing. Polishing can be performed using various polishing techniques, such as rough polishing, fine polishing, fixed abrasive grain processing (grinding), and loose abrasive grain processing (polishing).

As used herein, the expression "polishing" encompasses "grinding," which refers to cutting of a surface of the composite material 80 using abrasive grains having high hardness, such as diamond. The Cu-diamond composite material contains diamond, and therefore, an ideally flat surface may not be formed by polishing.

Collision or friction with abrasive grains may cause diamond particles to come off from a surface of the composite material, and therefore, even after polishing, recesses and protrusions similar to the size of diamond particles may remain at the processed surface of the composite material. Therefore, in the present disclosure, polishing and grinding are not distinguished from each other, and the "polishing step" encompasses a step of performing polishing and/or grinding.

Figure 14:
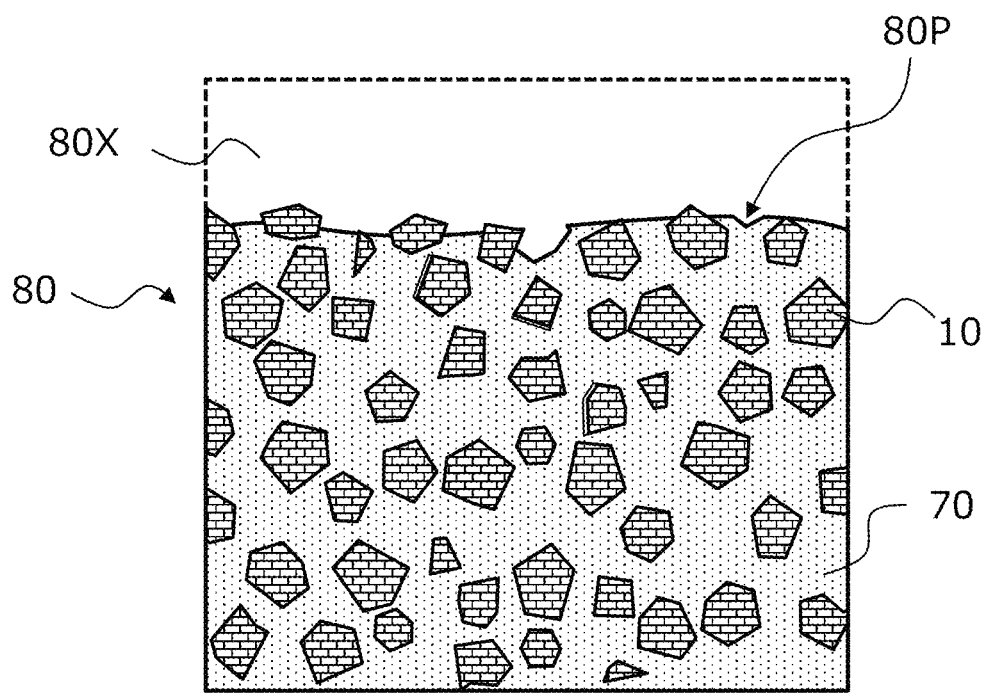
FIG. 14 is an enlarged cross-sectional view schematically showing a portion of a composite material subjected to a treatment to reduce thickness in an embodiment of the present disclosure.

FIG. 14 is a cross-sectional view schematically showing a processed surface 80P and portions near the composite material 80. A portion removed by the treatment to reduce thickness is indicated by reference character "80X." In the example of FIG. 14, the processed surface 80P has recesses and protrusions similar to the size of the diamond particles 10. For example, in the case in which the composite material 80 has a thickness of 1 mm before the polishing step, the thickness of the composite material 80 after the polishing step may, for example, be 100 μm or greater and 800 μm or less. Such a polishing step allows the thickness of the composite material 80 immediately after pulsed electric current sintering to be sufficiently greater than a required thickness of a heat dissipation member to be obtained. The present inventors' experiments demonstrated that if the composite material 80 to be produced is excessively thin, for example, heat generated by pulsed electric current sintering during the sintering step may be unevenly distributed, resulting in an increase in variations in characteristics of the composite material 80. Therefore, when the composite material 80 having a thickness greater than a target value is formed based on the premise that the thickness of the prepared the composite material 80 will be adjusted to the target value by the polishing step, variations in characteristics thereof can be reduced.

However, the present inventors' further study demonstrated that the thermal conductivity of the composite material 80 after the treatment to reduce thickness may be, for example, about 80% of the thermal conductivity before the treatment to reduce thickness. This is attributed to a reduction in relative density and thermal diffusivity of the composite material 80 due to the treatment to reduce thickness. For example, in the polishing step, a stress is generated when a portion of the composite material 80 is cut, which increases thermal resistance at an interface between the diamond particle 10 and the Cu 70, resulting in reduction in relative density and thermal diffusivity of the composite material 80. The reduction in relative density and thermal diffusivity of the composite material 80 is also partially attributed to a reduction in adhesion between diamond and Cu in the composite material due to vibration during polishing. The reduction in relative density indicates the occurrence of a plurality of empty cavities in the composite material 80. When laser processing is performed, the composite material is locally heated, so that the temperature of the composite material increases. Accordingly, the difference in coefficient of thermal expansion between the diamond particle 10 and the Cu 70 may cause a reduction in adhesion between diamond and Cu in the composite material. Such a factor in reduction of the thermal conductivity caused by treatment to reduce thickness will be hereinafter referred to as a "defect" or "damage" to the composite material. The reduction of the thermal conductivity described above caused by treatment to reduce may also occur in the case in which the matrix of the composite material contains a metal other than Cu.

In this embodiment, as shown in FIG. 7C, after step S200 in which the treatment to reduce thickness is performed, the step S300 of repairing defects by the second pulsed electric current sintering is performed. In step S300, the degree of defects or damage caused by the treatment to reduce thickness can be reduced, or the composite material can be recovered to a state before the treatment to reduce thickness. This can result in increase in the thermal conductivity having been lowered due to the treatment to reduce thickness. In other words, by the second pulsed electric current sintering, at least the relative density of the composite material 80 can be increased to be higher than that before the second pulsed electric current sintering. The second pulsed electric current sintering can be performed with a pressure of less than 50 MPa applied to the composite material.

In one embodiment, the second pulsed electric current sintering is performed under conditions of a low temperature and a low pressure as in the production of the composite material 80. More specifically, for example, in the sintering device 100 shown in FIG. 9, the composite material 80 after polishing is placed in the cavity 20 formed between the upper punch 40 and the lower punch 50. As the sintering device 100, a sintering device configured to perform pulsed electric current sintering is used. When the composite material 80 is prepared by subjecting a mixed powder of Cu and diamond to pulsed electric current sintering, it is preferable to use a sintering device that is the same as or the same type as that is used in preparing of the composite material 80. By the second pulsed electric current sintering, the composite material 80 is held at a temperature that is, for example, equal to or higher than 500° C. and lower than 800° C. with a pressure of, for example, equal to or more than 5 MPa and less than 50 MPa applied thereto. The hold time, which depends on the hold temperature, is, for example, 60 seconds or more and 1800 seconds or less. The pressure may be applied as the "cyclic pressurization" described above. The pulsed electric current sintering technique for increasing the thermal conductivity lowered due to the polishing step can include, for example, the various examples described above with reference to FIG. 10 and FIG. 11A and FIG. 11B, and does not need to be performed under the same conditions as those of the temperature and pressure set in the production of the composite material 80 from the mixed powder.

Figure 15:
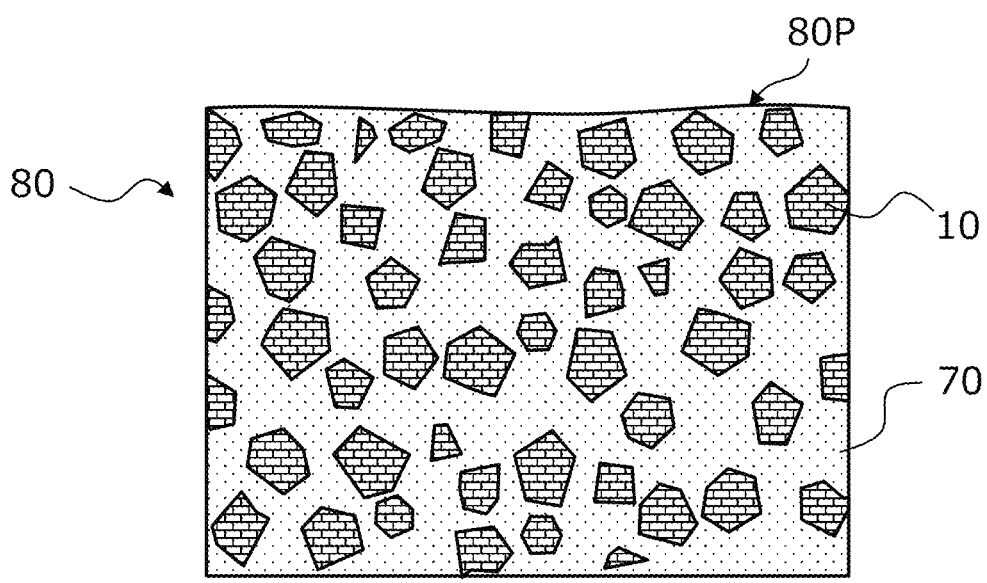
FIG. 15 is an enlarged cross-sectional view schematically showing a portion of a composite material serially subjected to a treatment to reduce thickness and then to pulsed electric current sintering in an embodiment of the present disclosure.

FIG. 15 is a cross-sectional view schematically showing a state of the composite material 80 that has been subjected to the polishing and then to the second pulsed electric current sintering. The second pulsed electric current sintering causes reduction of the degree of defects or damage that has been caused by the polishing step, so that the composite material 80 can be recovered to the state before the polishing step. The relative density of the composite material 80 is increased due to the temperature and pressure in the second pulsed electric current sintering step, which causes reduction in the thermal resistance at an interface between diamond particles and Cu or shortening of the heat dissipation path to increase the thermal diffusivity, which is thought to cause the recovery of the composite material 80.

In addition, it was demonstrated that by the second pulsed electric current sintering under conditions similar to those of the pulsed electric current sintering performed in the production of the composite material 80, the thermal diffusivity of the composite material 80 is increased compared to that before the second pulsed electric current sintering. The thermal conductivity and the thermal diffusivity have a relationship described below.

Thermal conductivity [W/m·K]=thermal diffusivity [m²/sec]×specific heat [J/K·kg]×density [kg/m³]

According to the result of experiments that will be described below, the relative density and thermal conductivity that are lowered due to the treatment to reduce thickness are both increased by the second pulsed electric current sintering. In addition, according to, for example, Experimental example 1 described below, it was demonstrated that the ratio by which the thermal conductivity is increased through the second pulsed electric current sintering is greater than the ratio by which the relative density is increased through the second pulsed electric current sintering. This indicates that the second pulsed electric current sintering increases the thermal diffusivity of the composite material 80 lowered due to the polishing. In other words, it is thought that the second pulsed electric current sintering not only increases the relative density of the composite material subjected to the polishing, but also contributes to repair defects and damage caused by the polishing.

The second pulsed electric current sintering may be performed with a metal powder or metal plate placed in contact with the processed surface 80P of the composite material 80. Examples of such a metal include Cu, Al, CuW, and CuMo.

Cu is preferably used in view of thermal conductivity and easiness of handling. CuW is preferably used in view of reducing a difference in thermal expansion between the metal and the composite material 80. The Cu powder or Cu plate is likely to be bonded to and integrated with Cu in the composite material 80. Through the second pulsed electric current sintering, the metal powder can be formed into a metal layer bonded to the processed surface 80P of the composite material 80. Also, when the metal plate is placed in contact with the processed surface 80P of the composite material 80, the second pulsed electric current sintering causes the metal plate to be formed into a metal layer bonded to the processed surface 80P of the composite material 80. When the metal plate has a sufficiently small thickness, the metal plate does not need to have self-stiffness. Such a thin metal plate may also be referred to as a metal thin film or foil.

Figure 16:
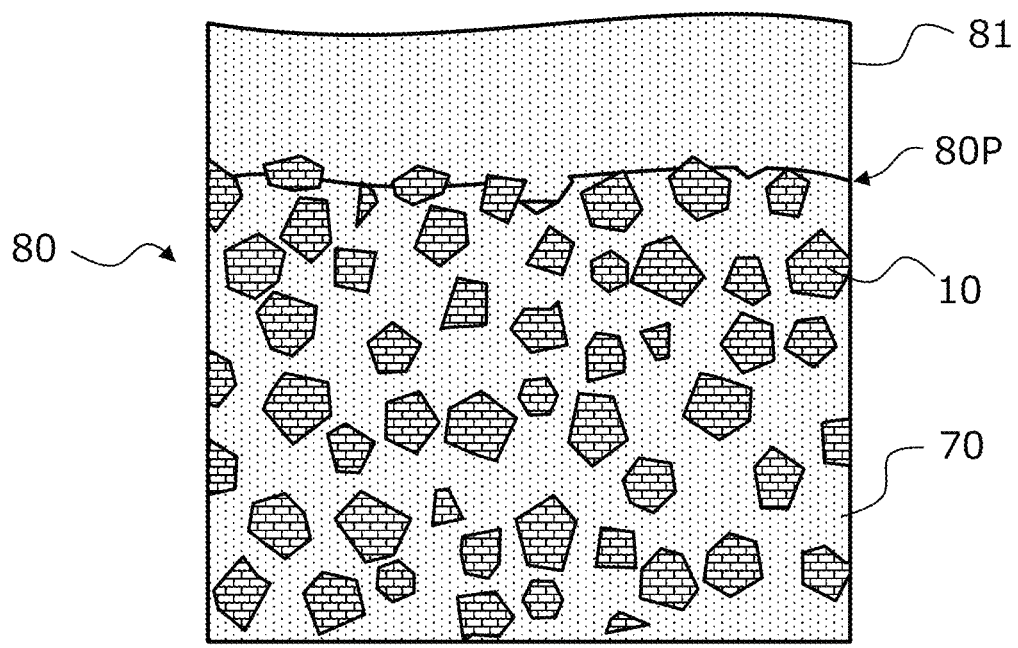
FIG. 16 is an enlarged cross-sectional view schematically showing a portion of a composite material in which a metal layer is disposed in an embodiment of the present disclosure.

FIG. 16 is a cross-sectional view schematically showing a portion of the composite material 80 having a metal layer 81 thus formed. Integral sintering is achieved between the metal layer 81 formed by the second pulsed electric current sintering and the underlying the composite material 80. In particular, when the metal layer 81 is formed of Cu, the metal layer 81 is continuous to Cu contained in the composite material 80. By such integral sintering, the composite material 80 and the metal layer 81 can be more firmly bonded together than in the case in which the metal is bonded to the processed surface 80P of the composite material 80 in a physical or chemical manner, or the case in which the metal layer is bonded to the composite material 80 via an adhesive material.

The surface of the metal layer 81 is pressed against the lower end surface of the upper punch 40, for example, in the sintering device 100 shown in FIG. 9 during the second pulsed electric current sintering step. The pressing is performed with the pressure, for example, equal to or more than 5 MPa and less than 50 MPa, and under the temperature, for example, equal to or higher than 500° C. and lower than 800° C. This allows the softened metal to be firmly bonded to the processed surface 80P. The thermal conductivity of the metal layer 81 is lower than that of diamond, and therefore, it is thought that an excessively thick metal layer 81 would result in reduction in the thermal conductivity of a composite substrate in which the composite material 80 and the metal layer 81 are integrally sintered. However, if the thickness of the metal layer 81 is, for example, 50 μm or greater and 1000 μm or less, the decrease in the thermal conductivity of the composite substrate can be reduced.

Performing pulsed electric current sintering with a metal powder placed in contact with the processed surface of the composite material 80 to form the metal layer 81 allows for facilitating increasing adhesion of the metal layer 81 to the composite material 80.

In the case in which the metal layer 81 is formed by the second pulsed electric current sintering with a metal plate placed in contact with the processed surface of the composite material 80, a metal plate having a predetermined thickness can be used, which allows for facilitating adjustment of the thickness of the metal layer 81 to a target value. Also, in the case of using a metal plate, the thermal conductivity of the metal plate can be maintained similar to the thermal conductivity of a metal that is used for a material of the metal plate. Therefore, with the composite material 80 having a thickness of equal to or greater than a predetermined thickness, the decrease in the thermal conductivity of a composite substrate obtained by integral sintering of the composite material 80 and the metal layer 81 can be reduced.

The metal layer 81 thus formed contains substantially no diamond particles 10, and accordingly can have a surface flatter than the processed surface 80P of the composite material 80. When a heat generation source such as a semiconductor light emitting device is in thermal contact with a heat dissipation member, the flat surface allows for providing a larger effective contact area, which contributes to a reduction in thermal resistance. In addition, with the metal layer 81 located on the surface of the composite material 80, the effect of facilitating plating, etc., can be obtained.

In an embodiment of the present disclosure, in order to perform direct bonding by atomic diffusion bonding, the upper surface of the metal layer 81 is polished to form the flat layer 82 of a metal. Polishing can be performed in various techniques. Because the metal layer 81 does not contain diamond particles, a flat surface suitable for direct bonding can be formed at the metal layer 81.

Figure 17:
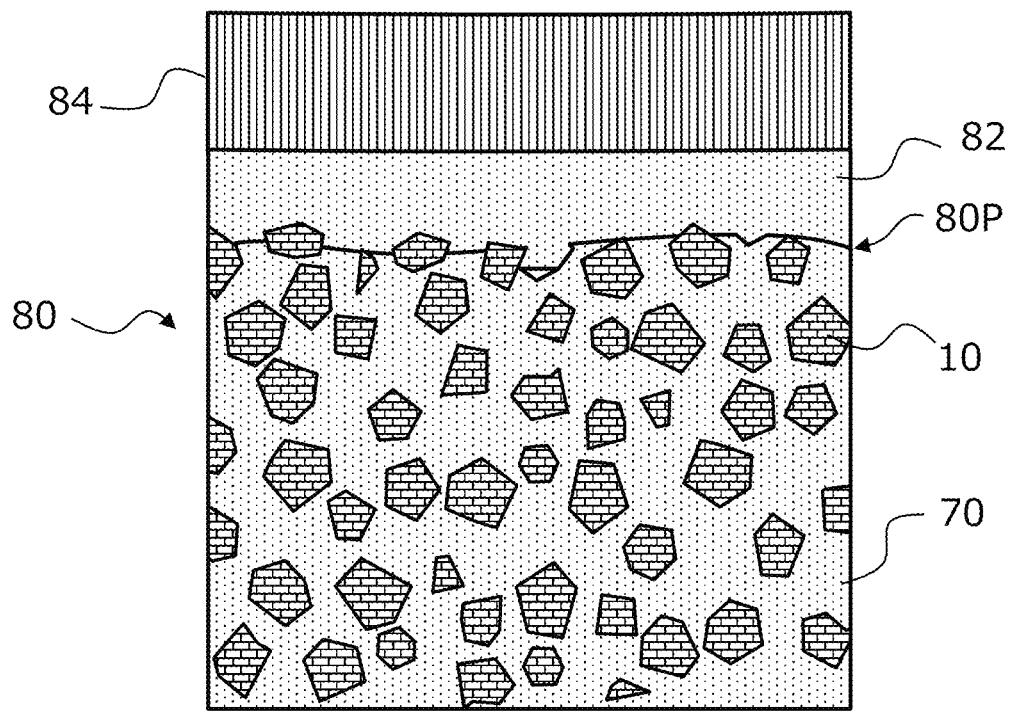
FIG. 17 is an enlarged cross-sectional view schematically showing a portion of a composite material with an insulating layer disposed on a metal layer in an embodiment of the present disclosure.

FIG. 17 is a cross-sectional view showing a state in which the insulating layer 84 is formed on the flat layer 82. The polished flat layer 82 has a flat surface compared to the composite material 80, and therefore, can maintain good adhesion to the insulating layer 84. In particular, the "direct bonding" described above, such as surface activated bonding or atomic diffusion bonding, requires preparation of a flat bonding surface. Such a flat bonding surface can be obtained by, for example, polishing the metal layer 81 to form the flat layer 82. The upper surface of the flat layer 82 has a surface roughness (Ra) of, for example, 10 nm or less, preferably 5 nm or less, and particularly preferably 1 nm or less. With surface activated bonding or atomic diffusion bonding, two materials can be bonded together even at room temperature. As used herein, the "room temperature" refers to, for example, 50° C. or lower, preferably 40° C. or lower. With these techniques, preferably, the metal layer 81 and the insulating layer 84 can be bonded together at a temperature that is lower than the highest temperature that can be reached by the composite substrate due to heat generated by a semiconductor device that is in thermal contact with the composite substrate. Therefore, the bonding interface between the metal layer 81 and the insulating layer 84 is less affected by stress caused due to the difference in coefficient of thermal expansion therebetween, advantageously resulting in a high bonding strength.

By singulating the composite material 80, in which the flat layer 81 and the insulating layer 84 thus layered are firmly bonded together, into individual pieces, a plurality of composite substrates can be obtained from the composite material 80.

Figure 18:
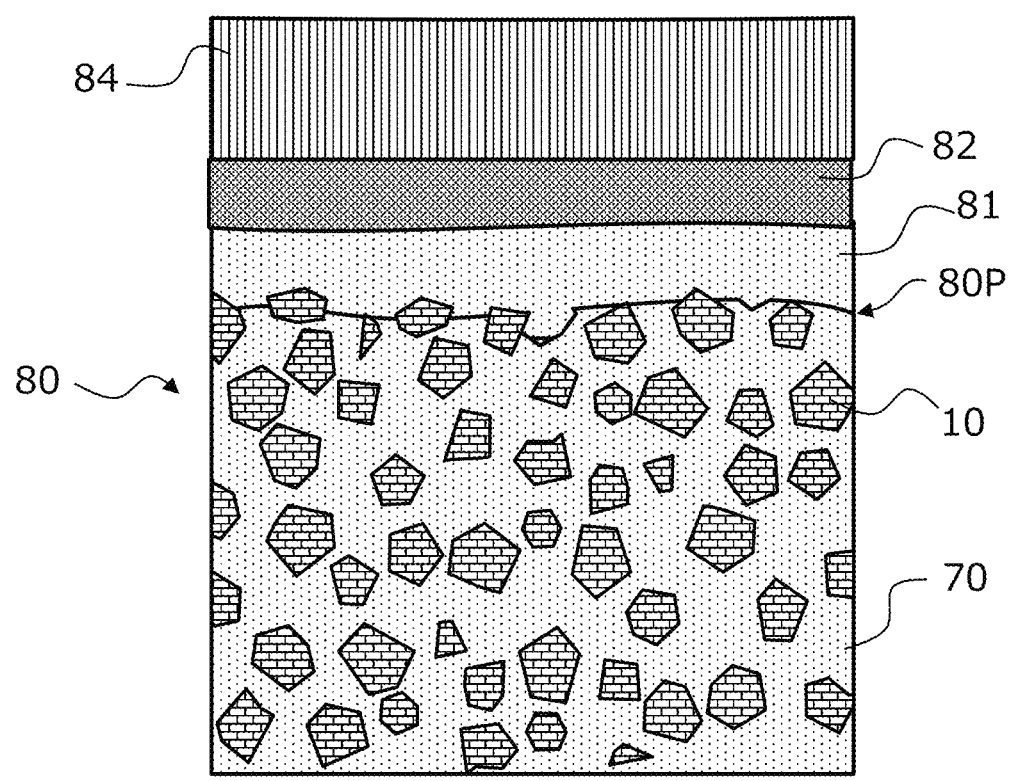
FIG. 18 is an enlarged cross-sectional view schematically showing a portion of a composite material with an insulating layer disposed on a metal layer in an embodiment of the present disclosure.

Alternatively, as shown in FIG. 18, a metal member having a thickness greater than the surface roughness of the metal layer 81 may be disposed on the metal layer 81, and the metal member may be polished to a surface roughness of 10 nm or less to form the flat layer 82. Examples of the metal member for the flat layer 82 include a plating layer of Cu or the like. The metal member may be a Cu film formed by other techniques. The Cu film can be formed by, for example, sputtering. In order to improve adhesion between the metal layer 81 and the metal member, an adhesive layer of titanium, nickel, gold, or the like may be provided on the surface of the metal layer 81. When the metal member is deposited using a thin film deposition technique, such as plating or sputtering, the metal member with uniform crystal orientation can be more easily obtained than forming the metal layer 81 using the technique described above. Therefore, a flat surface can be more easily formed by polishing on the metal member. Further, when the metal member is formed to have a thickness greater than the surface roughness of the metal layer 81, the metal member absorbs the recesses and protrusions of the metal layer 81, and therefore, the flatness can be improved by polishing. The metal member may be formed either before or after the metal layer 81 is polished. It is more preferable that the metal member be formed after the metal layer 81 is polished. This allows for more efficiently forming the flat layer 82. The composite material after the treatment to reduce thickness may have recesses and protrusions similar to the size of diamond particles. It is more efficient to form a metal member after the metal layer 81 is formed and planarized than to form a metal member by plating or sputtering to have a thickness that allows for absorbing such recesses and protrusions.

The step of preparing the layered body having the base layer formed of the composite material and the metal layer on the base layer may include a step of bringing a metal powder or metal plate into contact with a layer of a mixed powder containing a plurality of diamond particles and a plurality of metal powder particles, and a step of producing a composite material from the mixed powder to form a base layer and bonding a metal layer of the metal powder or metal plate to the first surface of the base layer, the producing the composite material and bonding the metal layer being performed by pulsed electric current sintering. Alternatively, as described above, the step of preparing the layered body may include a step of producing a composite material from a mixed powder containing a plurality of diamond particles and a plurality of metal powder particles by first pulsed electric current sintering to form a base layer, and a step of bonding the metal powder or metal plate to the first surface of the base layer by second pulsed electric current sintering to obtain the metal layer.

Thus, in embodiments of the present disclosure, the step of subjecting the composite material to a treatment to reduce thickness is not essential. However, as described above, when adjustment of the thickness of the composite material by polishing is required, the step of preparing the layered body includes, after the step of forming the base layer by the first pulsed electric current sintering, a step of subjecting the first surface of the base layer to a treatment to reduce thickness, and a step of bonding a metal powder or metal plate to the first surface of the base layer that has been subjected to the treatment to reduce thickness, by second pulsed electric current sintering, to obtain the metal layer.

The diamond configured to be contained in the base layer as described above can be obtained as illustrated below. In the step of forming the base layer, as the plurality of diamond particles included in the mixed powder, diamond particles having an L* value of 53 or greater in the CIE 1976 L*a*b* color system may be prepared. The "diamond particles having an L* value of 53 or greater in the CIE 1976 L*a*b* color system" means that the diamond particles collectively have an L* value of 53 or more. By forming the base layer using such diamond particles, the thermal conductivity of the base layer can be improved. L* represents lightness in the CIE 1976 L*a*b* color system. The CIE 1976 L*a*b* color system is one of the color spaces (uniform color spaces) standardized by the International Commission on Illumination (CIE). L* takes a value of 0 to 100.

The greater the value of L*, the higher the lightness represented by L*. The low value of L* of the diamond particles indicates that the diamond particles contains many nearly-black diamond particles. Such blackening of some of the diamond particles may be caused due to presence of impurities such as carbon components in a form different from that of diamond at the surface or inside of the diamond particle. An increase in the concentration of such impurities may lead to a reduction in lightness and thermal conductivity. L* is preferably 54 or greater, more preferably 55 or greater, and particularly preferably 56 or greater.

This allows for further improving the thermal conductivity of the composite material. L* may be 60 or less.

The diamond particles may also contain diamond particles having a high Fe impurity concentration (relatively low lightness). At the surface or inside of diamond particles having a relatively high Fe concentration, Fe may form a ferromagnetic metal (alloys may be contains) or a ferromagnetic compound (e.g., metal oxides). Such diamond particles are more likely to be attracted by magnetic force than are diamond particles having a relatively low Fe concentration. Therefore, the step of preparing the diamond particles described above can include a step of removing diamond particles containing ferromagnetic impurities by magnetic force. Through this step, diamond particles containing a large quantity of ferromagnetic metals, such as Fe, or ferromagnetic compounds can be removed. For example, by bringing a permanent magnet close to a plurality of diamond particles, diamond particles having a relatively high Fe concentration can be attracted by the permanent magnet and thus can be removed. Such screening by magnetic force (magnetic force screening) can be efficiently carried out with, for example, a permanent magnet placed at a position about several millimeters above the top surface of the belt of a belt conveyor (i.e., a space interposed), and a large number of diamond particles distributed on the traveling belt. Instead of the belt conveyor, a cylindrical drum device may be used. In order to facilitate the magnetic force screening, a large number of diamond particles dispersed in water or in free fall from above can be brought into direct or indirect contact with a magnet, instead of directly screening diamond particles in the powder form. Furthermore, ultrasonic vibrations may be applied to the diamond particle powder.

The magnetic force screening may be performed on any diamond used in the composite material. The magnetic force screening is preferably performed on diamond particles having an average particle size of 400 μm or greater and 600 μm or less. By performing the magnetic force screening on relatively large diamond particles, the thermal conductivity of the composite material is more likely to be improved.

The magnetic force screening can be used in order to screen not only for diamonds having a high Fe concentration, but also for other ferromagnetic metals, such as Ni and Co, or ferromagnetic compounds containing those ferromagnetic metals. The impurity content of diamond particles obtained by the magnetic force screening can be analyzed by, for example, X-ray fluorescence analysis (XRF analysis). The higher the Fe impurity concentration, the greater the amount of ferromagnetic alloys or ferromagnetic compounds formed by Fe at the surface or inside of diamond particles, and therefore, defects are more likely to be formed in diamond particles due to the difference in the coefficient of thermal expansion between the diamond and the ferromagnetic alloy or ferromagnetic compound. Therefore, it is thought that reducing the Fe impurity concentration of diamond particles allows for increasing the crystallinity of the diamond particles, so that the thermal conductivity of the diamond particles can be improved.

Examples of the method of producing the composite material of the present disclosure will be described below.

Experimental Example 1

A Cu-diamond MMC composite material was prepared. The composite material was obtained as described below. Cu powder particles having an average particle size of 5 μm and diamond particles having an average particle size of 250 μm were mixed together to obtain a mixed powder. The total weight of the mixed powder was 6.24 grams. The entire mixed powder contained 60 percent by mass of the Cu powder particles, 20 percent by mass of the diamond particles having an average particle size of 250 μm, and 20 percent by mass of diamond particles having an average particle size of 60 μm. Next, a Cu-diamond MMC having a thickness of 3 mm was prepared using a sintering device (model: SPS-515S) manufactured by SPS Syntex, Inc. The sintering peak temperature Ts was 670° C., and the applied pressure was 36 MPa. The sintering peak temperature Ts was maintained for 10 minutes. The degree of vacuum at the start of sintering was 10 Pa. The size of the composite material was 20 mm (diameter)×2.73 mm (thickness). After the composite material was obtained, the density and thermal diffusivity of the obtained composite material were measured. Conditions under which the composite material was prepared are shown in Table 1.

Next, the composite material thus prepared was subjected to mechanical polishing to form a processed surface of the composite material. By polishing, the thickness was reduced by 0.18 mm. After the processed surface was formed, the density and thermal diffusivity of the composite material were measured.

Next, the composite material having the processed surface thus formed was subjected to pulsed electric current sintering using the above sintering device to obtain a composite substrate. The sintering peak temperature Ts was 660° C., and the applied pressure was 36 MPa. The sintering peak temperature Ts was maintained for 10 minutes. The degree of vacuum at the start of sintering was 10 Pa. This pulsed electric current sintering caused reduction in the thickness of the composite material by 0.12 mm. After the composite substrate was obtained, the density and thermal diffusivity thereof were measured.

In Experimental example 1, and Experimental example 2 and Experimental example 3 that will be described below, the value of a current was 350 A or greater and 700 A or less while the sintering peak temperature Ts was maintained. The applied voltage had a pulse width of 3.3 milliseconds.

In preparation of a composite material, a first and a second pressure were repeatedly applied, where the first pressure was 10 MPa and the second pressure was 36 MPa. The application of the first pressure was maintained for 15 seconds, the application of the second pressure was maintained for 20 seconds, and the sum of times it took to change the pressures was 50 seconds.

The total time of a single cycle was 85 seconds. The number of cycles performed was 25. The sintering peak temperature Ts was maintained for 20 minutes. Conditions for the production of the above composite material are shown in Table 1.

The composite material was subjected to a treatment to reduce thickness to form a processed surface, and thereafter, pulsed electric current sintering was performed with Cu powder particles placed in contact with the processed surface, so that a layered body was obtained. Conditions for the pulsed electric current sintering were similar to those for the preparation of the composite material.

TABLE 1

| | Conditions for production of composite material | | | | | | | |
|---|---|---|---|---|---|---|---|---|
| | Sintering temperature (° C.) | Pressures (MPa) | | Average particle sizes (μm) | | | Mass fractions (mass %) | | |
| | | First pressure | Second pressure | Small diamond particles | Large diamond particles | Cu | Small diamond particles | Large diamond particles | Pressurization technique |
| Experimental example 1 | 670 | 36 | | 60 | 250 | 60 | 20 | 20 | Continuous pressurization |
| Experimental example 2 | 660 | 36 | | 60 | 250 | 65 | 15 | 20 | Continuous pressurization |
| Experimental example 3 | 660 | 10 | 36 | 60 | 250 | 65 | 15 | 20 | Cyclic pressurization |

Experimental Example 2

A composite material was obtained in a manner as in Experimental example 1, except for the differences described below.

A composite material was prepared using Cu powder particles and diamond particles at a different mixing ratio. The mixed powder contained 65 percent by mass of the Cu powder particles, 20 percent by mass of diamond particles having an average particle size of 250 μm, and 15 percent by mass of diamond particles having an average particle size of 60 μm, with respect to the entire mixed powder. Pulsed electric current sintering was performed, where the sintering peak temperature Ts was 660° C. Conditions for the production of the composite material described above are shown in Table 1.

The composite material was subjected to polishing to form a processed surface, and thereafter, pulsed electric current sintering was performed with a Cu plate placed in contact with the processed surface, so that a layered body was obtained. Conditions for the pulsed electric current sintering were similar to those for the preparation of the composite material.

Experimental Example 3

A composite material was obtained in a manner as in Experimental example 1, except for the differences described below.

Thermal Conductivity

The thermal conductivity was determined for each of Experimental examples 1 to 3. The thermal conductivity can be calculated from the product of the specific heat, density, and thermal diffusivity. The specific heat was calculated by weighting the literature values of the specific heats of diamond and Cu by the respective mass fractions in the mixture. The density was measured by Archimedes' technique. The thermal diffusivity was determined by a flash technique with a xenon lamp using a measurement device (model: LFA-447) manufactured by NETZSCH Japan K. K. The measurement temperature was 25° C. In Experimental example 1, the composite material had a thickness of 2.73 mm, a thickness of 2.55 mm after polishing, and a thickness of 2.43 mm after pulsed electric current sintering. In Experimental example 2, the composite material had a thickness of 2.64 mm, and a thickness of 2.49 mm after polishing. The composite substrate had a thickness of 2.56 mm after pulsed electric current sintering. In Experimental example 3, the composite material had a thickness of 2.64 mm, and a thickness of 2.45 mm after polishing. The composite substrate had a thickness of 2.51 mm after pulsed electric current sintering. The "relative densities" before polishing, after polishing, and after the second pulsed electric current sintering are shown in Table 2, the "thermal diffusivity" is shown in Table 3, and the "thermal conductivity" is shown in Table 4. The "relative density" in Table 2 represents the relative ratio of the actual density to the absolute specific gravity of the composite material. In Experimental examples 2 and 3, the true density after the second pulsed electric current sintering is the density of the layered body obtained by sintering the composite material and Cu powder particles, or the composite material and a Cu plate, and therefore, the influence of the second pulsed electric current sintering on the density is obscure. Accordingly, the relative density was determined for "after the composite material preparation," "after the processed surface formation," and "after the second pulsed electric current sintering," i.e., changes in relative density were studied.

TABLE 2

| | Relative densities (%) | | |
|---|---|---|---|
| | After composite material preparation | After processed surface formation | After second pulsed electric current sintering |
| Experimental example 1 | 94.2 | 93.4 | 95.2 |
| Experimental example 2 | 96.7 | 95.6 | 96.3 |
| Experimental example 3 | 97.2 | 96.3 | 97.0 |

TABLE 3

| | Thermal diffusivities (mm/s$^2$) | | |
|---|---|---|---|
| | After composite material preparation | After processed surface formation | After second pulsed electric current sintering |
| Experimental example 1 | 298.5 | 234.5 | 282.7 |
| Experimental example 2 | 296.3 | 239.1 | 232.3 |
| Experimental example 3 | 306.4 | 241.7 | 240.3 |

TABLE 4

| | Thermal conductivities (W/m · K) | | |
|---|---|---|---|
| | After composite material preparation | After processed surface formation | After second pulsed electric current sintering |
| Experimental example 1 | 671.6 | 523.1 | 642.7 |
| Experimental example 2 | 708.4 | 565.5 | 570.2 |
| Experimental example 3 | 737.0 | 575.6 | 595.1 |

As can be seen from Tables 2 and 3, in all of the Experimental examples 1 to 3, the relative density and thermal diffusivity decreased due to the polishing step. However, the relative densities of the composite material or the layered body of Experimental examples 1 to 3 that were subjected to the second pulsed electric current sintering after the formation of the processed surface all had a relative density higher than those after the formation of the processed surface. Likewise, the thermal conductivity after the second pulsed electric current sintering was higher than that after the formation of the processed surface.

In Experimental examples 2 and 3, the layered body having the base layer formed from the composite material, and the metal layer bonded to the polished surface of the base layer, was obtained.

Thus, according to Experimental examples 2 and 3, even in the case in which the composite material containing diamond and a metal is subjected to a treatment to reduce thickness for thickness adjustment, the metal layer is formed that can recover the thermal conductivity from the reduction thereof due to the polishing step, and can be used for planarization, and therefore, an insulating layer can be directly bonded to the composite material at room temperature. Such room-temperature direct bonding allows for selecting, as a material for the flat layer, a metal that has good heat conductivity and a coefficient of thermal expansion that is, for example, at least two times as great as those of the composite material and the insulating layer, resulting in a composite substrate having good heat dissipation properties. A material for such a flat layer is, for example, Cu.

In embodiments of the present disclosure, the step of preparing the composite material containing diamond and Cu may be performed using various known techniques. Experimental examples of the step of preparing the composite material containing diamond and Cu will be described below. After the composite materials of the Experimental Examples described below are prepared, the above step of forming the flat layer and the above step of forming the insulating layer by direct bonding can be performed.

Experimental Example 4

Cu powder particles having an average particle size of 5 μm and diamond particles having an average particle size of 250 μm were mixed together to obtain a mixed powder. The total weight of the mixed powder was 6.24 grams. The entire mixed powder contained 80 percent by mass of the Cu powder particles and 20 percent by mass of the diamond particles. Next, a Cu-diamond MMC having a thickness of 3 mm was prepared using a sintering device (model: SPS-515S) manufactured by SPS Syntex, Inc. The sintering peak temperature Ts was 500° C., and the applied pressure was 36 MPa. The sintering peak temperature Ts was maintained for 10 minutes. The degree of vacuum at the start of sintering was 10 Pa. Conditions under which the composite material was produced and an estimated thermal conductivity are shown in Table 5.

Experimental Example 5

A Cu-diamond MMC was obtained in a manner as in Experimental example 4, except that the sintering temperature and the applied pressure were changed to 600° C. and 10 MPa, respectively.

Experimental Example 6

A Cu-diamond MMC was obtained in a manner as in Experimental example 4, except that the sintering temperature was changed to 600° C.

Experimental Example 7

A Cu-diamond MMC was obtained in a manner as in Experimental example 4, except that the sintering temperature and the applied pressure were changed to 600° C. and 90 MPa, respectively.

Experimental Example 8

A Cu-diamond MMC was obtained in a manner as in Experimental example 4, except that the sintering temperature was changed to 640° C., and a bimodal mixed powder was used that was obtained by mixing 10 percent by mass of small diamond particles having an average particle size of 60 µm, and 20 percent by mass of large diamond particles having an average particle size of 250 µm, with respect to the entire mixed powder.

Experimental Example 9

A Cu-diamond MMC was obtained in a manner as in Experimental example 4, except that the sintering temperature was changed to 750° C.

Experimental Example 10

A composite material was obtained in a manner as in Experimental example 8, except for the differences described below. The first and second pressures were repeatedly applied, where the first pressure was 10 MPa, and the second pressure was 36 MPa. The application of the first pressure was maintained for 15 seconds, the application of the second pressure was maintained for 20 seconds, and the sum of times it took to change the pressures was 50 seconds. The total time of a single cycle was 85 seconds. The number of cycles performed was 25. The sintering peak temperature Ts was maintained for 20 minutes.

Experimental Example 11

A Cu-diamond MMC was obtained in a manner as in Experimental example 10, except that the sintering temperature was changed to 660° C., and a bimodal mixed powder was used which was obtained by mixing 15 percent by mass of small diamond particles having an average particle size of 60 µm, and 20 percent by mass of large diamond particles having an average particle size of 250 µm, with respect to the entire mixed powder.

Experimental Example 12

A Cu-diamond MMC was obtained in a manner as in Experimental example 10, except that the first pressure was 50 MPa, and the second pressure was 90 MPa.

In Experimental examples 1 to 12, in the step of providing a composite material, a mixed powder of diamond particles and Cu powder particles was prepared, and pulsed electric current sintering was performed on the mixed powder with a pressure of 5 MPa or greater and 100 MPa or less applied thereto and the temperature maintained equal to or higher than 500° C. and lower than 800° C., to obtain a composite material from the mixed powder. The composite materials of Experimental examples 1 to 12 had a thermal conductivity higher than that of Cu alone. The composite materials of Experimental examples 4 to 12 can be used as those of Experimental examples 1 to 3.

TABLE 5

| | Conditions for production of composite material | | | | | | | | | Result |
|---|---|---|---|---|---|---|---|---|---|---|
| | | Pressures (MPa) | | Average particle sizes (µm) | | | Mass fractions (mass %) | | | Thermal |
| | Sintering temperature (° C.) | First pressure | Second pressure | Small diamond particles | Large diamond particles | Cu | Small diamond particles | Large diamond particle | Pressurization technique | conductivity (W/m · K) |
| Ex. ex. 4 | 500 | 36 | | | 250 | 80 | | 20 | Continuous pressurization | 586.3 |
| Ex. ex. 5 | 600 | 10 | | | 250 | 80 | | 20 | | 496.8 |
| Ex. ex. 6 | 600 | 36 | | | 250 | 80 | | 20 | | 625.7 |
| Ex. ex. 7 | 600 | 90 | | | 250 | 80 | | 20 | | 532.2 |
| Ex. ex. 8 | 640 | 36 | | 60 | 250 | 70 | 10 | 20 | | 672.1 |
| Ex. ex. 9 | 750 | 36 | | | 250 | 80 | | 20 | | 486.2 |
| Ex. ex. 10 | 640 | 10 | 36 | 60 | 250 | 70 | 10 | 20 | Cyclic pressurization | 702.7 |
| Ex. ex. 11 | 660 | 10 | 36 | 60 | 250 | 65 | 15 | 20 | | 673.2 |
| Ex. ex. 12 | 640 | 50 | 90 | 60 | 250 | 70 | 10 | 20 | | 606.4 |

Note)
Ex. ex. is the abbreviation of Experimental example.

Figure 19:
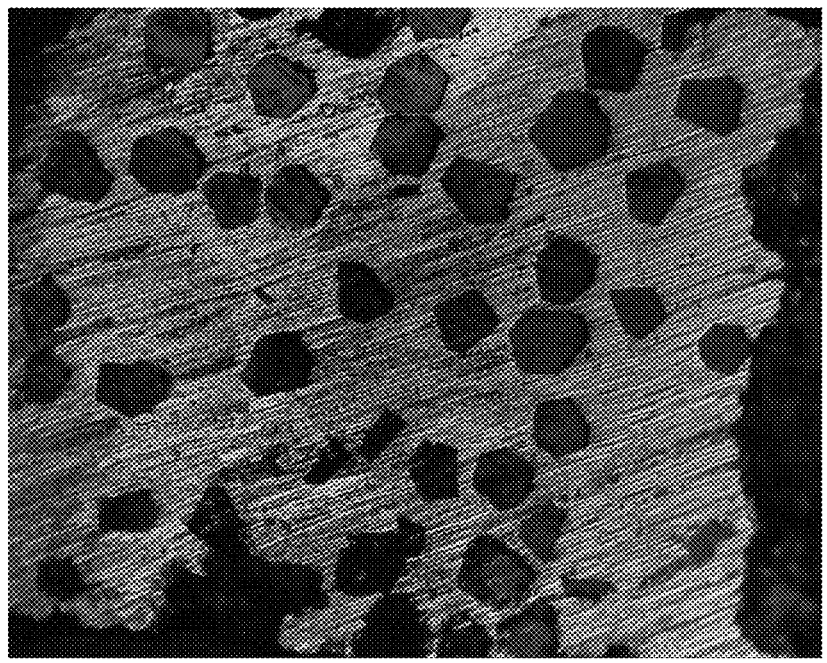
FIG. 19 is a microscopic photograph of a cross-section of a portion of a composite material in an experimental example.
Figure 20:
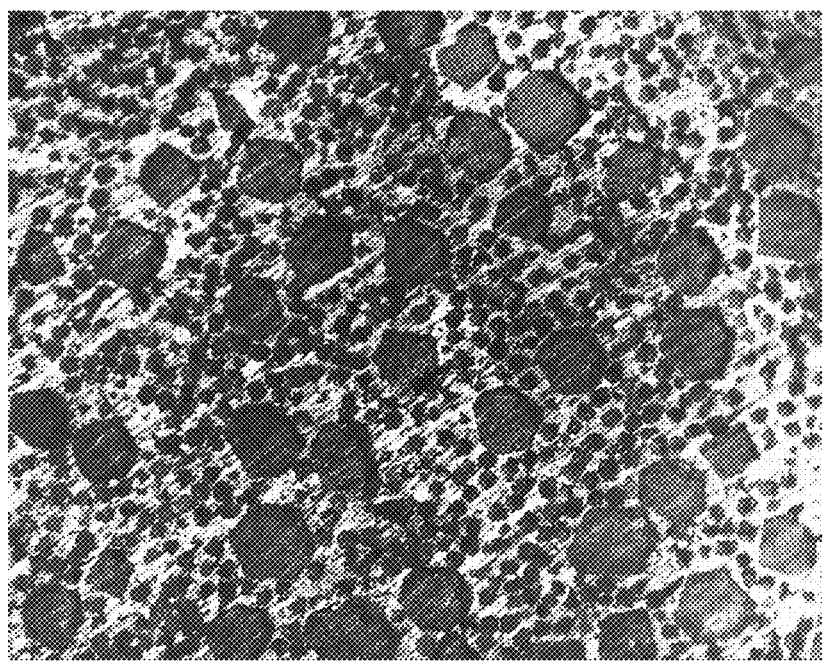
FIG. 20 is a microscopic photograph of a cross-section of a portion of a composite material in another experimental example.

FIG. 19 is an optical microscopic photograph of a cross-section of a portion of a composite material produced in a manner similar to that of Experimental example 6 of Table 5. FIG. 20 is an optical microscopic photograph of a cross-section of a portion of a composite material produced in a manner similar to that of Experimental example 10 of Table 5. In each photograph, a region having a relatively high lightness corresponds to a portion where Cu is present, and a region having a relatively low lightness corresponds to diamond particles. In the composite material of FIG. 20, relatively small diamond particles having an average particle size of 60 µm are located in spaces between relatively large diamond particles having an average particle size of 250 µm. Compared to the composite material of FIG. 19, the composite material of FIG. 20 contains an increased number of diamond particles and an increased total area of the surfaces thereof. This indicates an increase in interface area between Cu and diamond. The increase in interface area may cause an increase in thermal resistance due to poor adhesion between diamond and Cu, likely leading to decrease in thermal conductivity. However, in Experimental Example 10, such a phenomenon was not observed. As can be seen from FIGS. 19 and 20, the composite materials of Experimental Examples 6 and 10 are dense.

Experimental Example 13

In this experimental example, a plurality of diamond particles having an average particle size of 500 μm were provided. Thereafter, these diamond particles were subjected to a step (step of screening) of visually selecting diamond particles having a particularly low lightness (e.g., nearly black) and removing the selected diamond particles. After the removal of diamond particles having a low lightness, the L* value of the remaining diamond particles was measured.

Figure 21A:
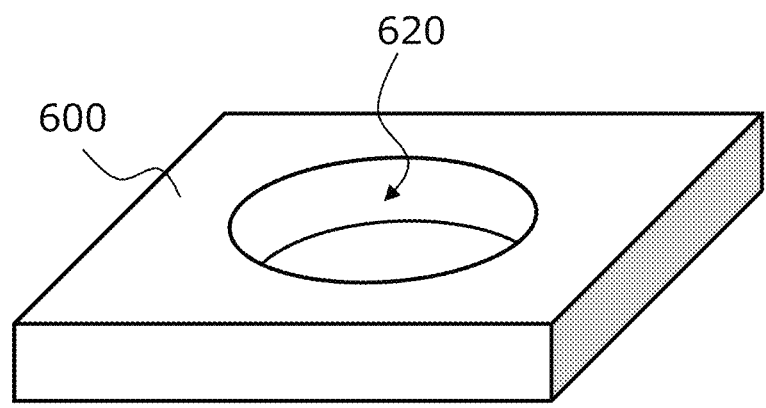
FIG. 21A is a perspective view schematically showing an example of a jig used in lightness measurement.
Figure 21B:
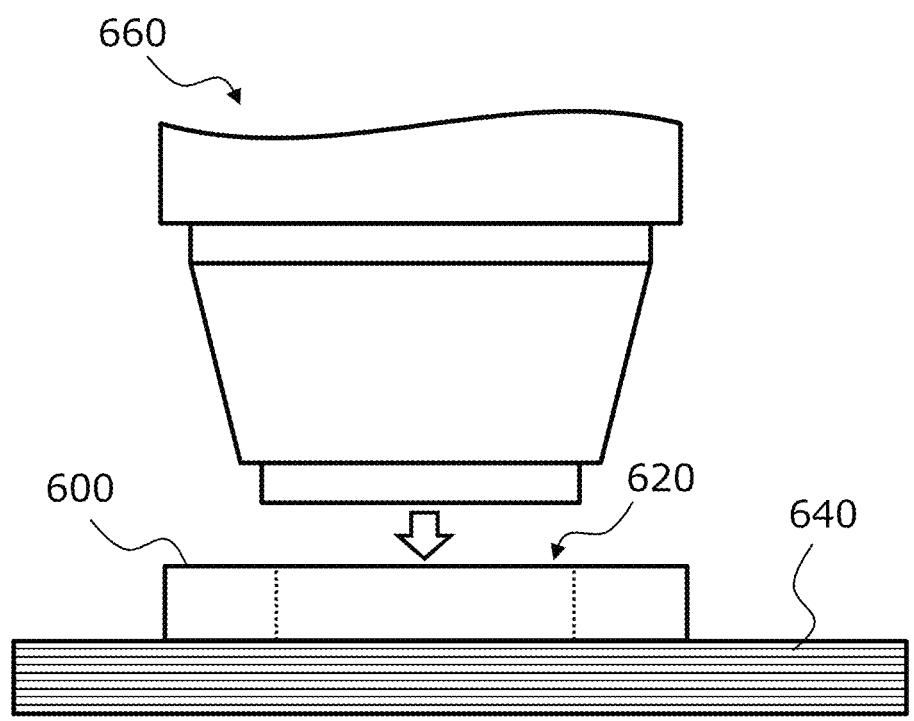
FIG. 21B is a side view schematically showing how lightness measurement is carried out.

The L* value of the diamond particles after the step of screening in this experimental example was 55.63. This measurement was carried out with the diamond particles filling an opening 620 of a jig 600 shown in FIG. 21A. More specifically, as shown in FIG. 21B, the jig 600 was placed on a stack of 20 sheets of white paper 640, and the diamond particles were filled in the opening 620 of the jig 600. Thereafter, a spectrophotometric color difference measurement device 660 was pressed against the upper surface of the jig 600 to measure lightness while preventing the entry of external light into the opening 620. The jig 600 was made of a metal (specifically, SUS). The opening 620 had a depth of 4 mm and a diameter of 15 mm. The spectrophotometric color difference measurement device 660 was the "handy spectrophotometric color difference meter NF555 (tradename)," manufactured by Nippon Denshoku Industries Co. Ltd.

In order to obtain a first reference value (ref. 1) of L*, L* was measured with respect to the 20-sheet white paper stack 640 by the spectrophotometric color difference measurement device 660. In this measurement, the jig 600 of FIG. 21A was not used, and the spectrophotometric color difference measurement device was directly pressed against the 20-sheet white paper stack 640 to measure lightness while preventing entry of external light into the opening 620. The L* obtained by the measurement, i.e., the first reference value (ref. 1), was 93.62. In addition, in order to obtain a second reference value (ref. 2) of L*, the jig 600 of FIG. 21A was pressed against the 20-sheet white paper stack, and L* was measured with respect to the white paper located inside the opening 620 by the spectrophotometric color difference measurement device 660 while preventing entry of external light into the opening 620. The L* obtained by this measurement, i.e., the second reference value (ref. 2), was 61.58.

The relative value of L* (55.63) of the diamond particles after the step of screening in this experimental example with respect to the reference value (ref. 2) was calculated to be 0.903.

Thus, the measurement of L* in the present disclosure is performed using a spectrophotometric color difference measurement device on diamond particles that are placed in a space into which external light does not enter. When obtaining a relative value, the measured value of L* of a stack of sheets of white paper in a space filled with diamond particles can be used as a reference value.

Next, the diamond particles having an L* of 55.63 obtained in the step of screening described above were mixed with Cu powder particles having an average particle size of 5 μm to obtain a mixed powder. The total weight of the mixed powder was 6.24 grams. The proportion of the Cu powder particles to the entire mixed powder was 80 percent by mass, and the proportion of the diamond particles to the entire mixed powder was 20 percent by mass. Next, a Cu-diamond MMC having a thickness of 4 mm was produced using a sintering device (model: SPS-515S) manufactured by SPS Syntex Inc. More specifically, a pressure of 36 MPa was applied. The sintering peak temperature Ts was 620° C., and the hold time was 10 to 15 minutes. The sintering was carried out in a vacuum atmosphere.

The diamond particles having an L* value of 55.63 obtained in the step of screening described above was mixed with diamond particles having an average particle size of 50 μm and Cu powder particles having a particle size of 5 μm to obtain another mixed powder (bimodal mixed powder). The total weight of the obtained mixed powder was 5.76 grams. The proportion of the Cu powder particles to the entirety of the obtained mixed powder was 70 percent by mass, the proportion of the diamond particles having a particle size of 500 μm to the entirety of the obtained mixed powder was 20 percent by mass, and the proportion of the diamond particles having a particle size of 50 μm to the entirety of the obtained mixed powder was 10 percent by mass. Next, a Cu-diamond MMC having a thickness of 3 mm was produced using a sintering device (model: SPS-515S) manufactured by SPS Syntex Inc. More specifically, a first pressure of 10 MPa and a second pressure of 36 MPa were repeatedly applied. The applied first pressure was maintained for 15 seconds, the applied second pressure was maintained for 20 seconds, and the total time during which the pressures were changed was 50 seconds. Thus, the total time of a single cycle was 85 seconds.

The cycle was performed 25 times. The sintering peak temperature Ts was 660° C., and the hold time was 40 minutes. The sintering atmosphere was a vacuum during increase of temperature from room temperature to 430° C., and was a mixed gas atmosphere of nitrogen and hydrogen when the temperature was 430° C. or higher.

The result of measurement of the thermal conductivity of each Cu-diamond MMC obtained by sintering as described above is shown in Table 6.

TABLE 6

| | Magnetic force screening | Diamond particles for which lightness is to be measured | L* | L* (relative value) | Thermal conductivity (W/m · K) 80/20 | Thermal conductivity (W/m · K) 70/20/10 | XRF impurity (ppm) Fe |
|---|---|---|---|---|---|---|---|
| Experimental example 13 | No | Particles after visually removal of black particles | 55.63 | 0.903 | 620.5 | 760.0 | |
| Experimental example 14 | Yes | Particles remaining after magnetic force screening | 56.38 | 0.916 | 628.2 | 752.3 | 104 |
| Experimental example 15 | Yes | Particles after visually removal of black particles from particles remaining after magnetic force screening | 56.65 | 0.920 | | 784.5 | 111 |

TABLE 6-continued

| | Magnetic force screening | Diamond particles for which lightness is to be measured | L* | L* (relative value) | Thermal conductivity (W/m·K) 80/20 | Thermal conductivity (W/m·K) 70/20/10 | XRF impurity (ppm) Fe |
|---|---|---|---|---|---|---|---|
| Experimental example 16 | Yes | Particles collected by first magnetic force screening | 53.16 | 0.863 | 583.2 | | |
| Experimental example 17 | Yes | Particles collected by second magnetic force screening | 53.07 | 0.862 | | 734.1 | |
| Experimental example 18 | No | No screening | 54.73 | 0.889 | 586.9 | 724.8 | 113 |
| Ref. 1 | No | Stack of 20 sheets of white paper | 93.62 | 1.520 | | | |
| Ref. 2 | No | White paper of ref. 1 + jig only | 61.58 | 1.000 | | | |

Experimental Example 14

In this experimental example, a sample was produced under the same conditions, except for screening of the diamond particles.

The screening was performed on diamond particles (powder) having an average particle size of 500 μm, which is the same as those in Experimental example 13. Experimental examples 15 to 18 to be described below are the same as Experimental example 13 in diamond particles subjected to the screening, and are different from Experimental example 13 only in the step of screening.

In Experimental example 14, magnetic force screening was performed on the diamond particles as described above. The Fe impurity concentration of diamond particles that had not been attracted by a magnet and therefore had been left was measured by X-ray fluorescence analysis (XRF analysis). The measured value was 104 ppm. The XRF analysis was performed using "ZSX Primus II" (trade name), manufactured by Rigaku Corporation. When the impurity to be measured was Fe, the measurement was performed at a tube voltage of 50 kV and a tube current of 60 mA. The X-ray source was Rh (K$\alpha_1$ ray), and a scintillation counter was used as the X-ray detector when Fe (K$\alpha_1$ ray) was to be detected. The energy resolution was about 20 eV (the half-value width of Mn, where 2θ corresponds to 1.5 degrees).

In this experimental example, a mixed powder and a bimodal mixed powder were prepared using the diamond particles that had not been attracted by a magnet and therefore had been left, and a Cu-diamond MMC was produced in a manner similar to that of Experimental example 13. The lightness of the diamond particles that had not been attracted by a magnet and therefore had been left was measured in a manner similar to that of Experimental example 13. The thermal conductivity of the Cu-diamond MMC obtained by sintering was measured. The result is shown in Table 6.

Experimental Example 15

In this experimental example, the diamond particles that had not been attracted by a magnet and therefore had been left in the magnetic force screening of Experimental example 14 was subjected to a step of additional screening in which black diamond particles were visually selected and removed. This experimental example is different from Experimental example 14 in this regard. The lightness measurement described above was performed on the diamond particles after the step of additional screening, and as a result, the L* value thereof was 56.65 (relative value: 0.920). The L* value of the diamond particles after the step of screening of Experimental example 14 was 56.38 (relative value: 0.916). Thus, an increase in lightness was observed.

In Experimental example 15, the measured value of the Fe concentration of the diamond particles that had been left after the magnetic force screening and the visual screening was 111 ppm.

The bimodal mixed powder described in Experimental example 13 was prepared using the diamond particles after these screenings, and a Cu-diamond MMC was produced in a manner similar to that of Experimental example 13. The thermal conductivity of the Cu-diamond MMC thus obtained was measured. The result is shown in Table 6.

Experimental Example 16

In this experimental example, the lightness measurement described above was performed on diamond particles removed from the diamond particles by the magnetic force screening in Experimental example 14 (that is, diamond particles attracted and collected by a magnet). The L* value of such diamond particles was 53.16 (relative value: 0.863). The L* value of the diamond particles after the step of screening in Experimental example 14 was 56.38 (relative value: 0.916). Therefore, it was observed that diamond particles having a relatively low lightness were collected by the magnetic force screening.

The mixed powder (Cu powder particles: 80 percent by mass, diamond particles: 20 percent by mass) described in Experimental example 13 was prepared using the diamond particles collected by magnetic force, and a Cu-diamond MMC was produced in a manner similar to that of Experimental example 13. The thermal conductivity of the Cu-diamond MMC thus obtained was measured. The result is shown in Table 6.

Experimental Example 17

In this experimental example, the diamond particles that had not been attracted by a magnet and therefore had been left after the magnetic force screening (first magnetic force screening) in Experimental example 14 was subjected to a second magnetic force screening. The above lightness measurement was performed on the diamond particles that had been attracted and collected by a magnet in the second magnetic force screening. The L* value of these diamond particles was 53.07 (relative value: 0.862).

The bimodal mixed powder described in Experimental example 13 was prepared using the diamond particles that had been collected by the second magnetic force screening, and a Cu-diamond MMC was produced in a manner similar to that of Experimental example 13. The thermal conductivity of the Cu-diamond MMC thus obtained was measured. The result is shown in Table 6.

Experimental Example 18

In this experimental example, the same experiment as that of Experimental example 13 was conducted, except that diamond particles that had not been subjected to the step of screening described above were used.

The lightness measurement described above was performed on the diamond particles that had not been subjected to the step of screening, and as a result, the L* thereof was 54.73 (relative value: 0.889). The measured value of the Fe concentration of the diamond particles was 113 ppm. Mixed powders similar to the mixed powder and bimodal mixed powder, respectively, described in Experimental example 13 were prepared using such diamond particles, and a Cu-diamond MMC was produced in a manner similar to that of Experimental example 13. The thermal conductivity of the Cu-diamond MMC thus obtained was measured. The result is shown in Table 6.

Figure 21C:
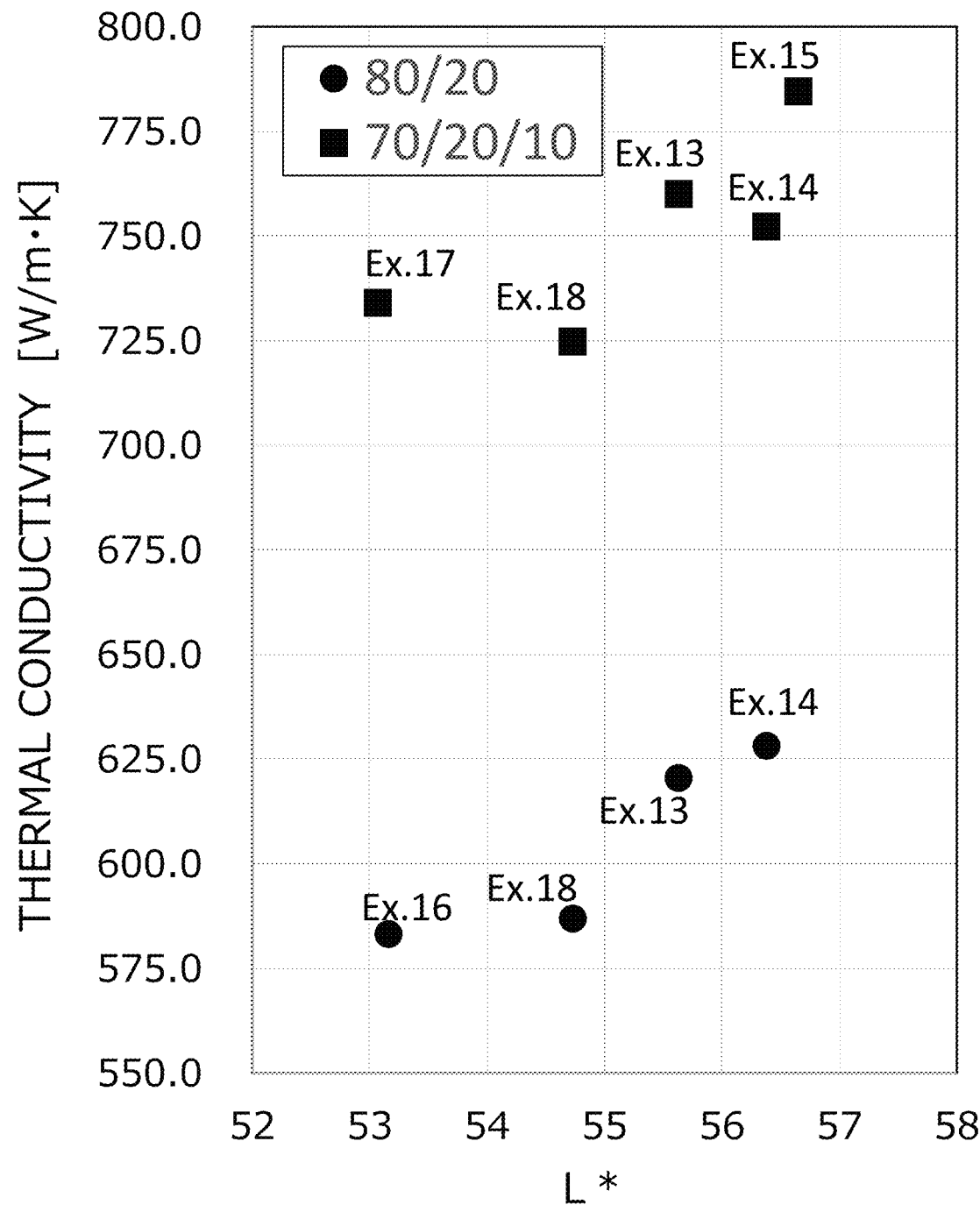
FIG. 21C is a graph showing results of measurement of L* and thermal conductivity obtained in Experimental examples 13 to 18.

FIG. 21C is a graph showing results of measurement of L* value and thermal conductivity obtained in Experimental examples 13 to 18. In the graph, Ex. 13 to Ex. 18 indicate data of Experimental examples 13 to 18, respectively. In FIG. 21C, solid circles indicate samples in which a mixed powder including 80 percent by mass of Cu powder particles and 20 percent by mass of diamond particles was used. Solid squares indicate samples in which a bimodal powder of diamond particles was used as a mixed powder.

As can be seen from the graph of FIG. 21C, in all of the experimental examples, a high thermal conductivity exceeding 575 [W/m·K] was achieved.

Therefore, it can be seen that, when the L* value of the diamond particles contained in the base layer is 53 or greater (relative value: 0.86 or more), a high thermal conductivity exceeding 575 [W/m·K] was achieved. In addition, it was observed that the thermal conductivity tends to increase with an increase in L* value. The L* value is preferably 54 or greater (relative value: 0.88 or greater), more preferably 55 or greater (relative value: 0.89 or greater), and particularly preferably 56 or greater (relative value: 0.91 or greater). With such a value, the thermal conductivity of the composite material can be further improved.

As can be seen from Table 6, comparison of Experimental example 18, in which the magnetic force screening was not performed, with Experimental examples 14 and 15, in which the magnetic force screening was performed, shows that the amounts of Fe impurities in Experimental examples 14 and 15 are lower than that in Experimental example 18. It was also confirmed that the thermal conductivities in Experimental examples 14 and 15 are higher than that in Experimental example 18. It is inferred that not only L* but also Fe impurities are among the factors that improve the thermal conductivity.

After these composite materials are prepared, the polishing step, the metal layer formation step, the metal layer polish step may be performed as described in Experimental examples 1 to 3 to obtain experimental examples of the composite substrate of the present disclosure.

Semiconductor Device

An example of a semiconductor device using the composite material of the present disclosure will be described below.

The composite material containing diamond particles and a metal has conductivity as a whole because the continuous metal matrix allows a current to pass. Therefore, when a semiconductor device is bonded to the composite material as described above and is used, disposing an insulating layer (insulating member) on a surface of the composite material allows a semiconductor device to be mounted with a conductive portion (e.g., a semiconductor substrate) thereof placed in contact with the insulating layer of the composite material. In addition, when the coefficient of thermal expansion of the insulating layer is set to an intermediate value between that of the composite material and that of the semiconductor device, the detachment of the semiconductor device from the composite material due to the difference in coefficient of thermal expansion can be reduced.

Meanwhile, utilizing the conductivity of the composite material, the semiconductor device and the composite material can be electrically connected to each other to allow the composite material to serve as a portion of a current path. In this case, the composite material can serve as a heat dissipation path and a current path. The composite material to which the insulating layer is directly bonded can further include a conductive layer on the insulating layer. The conductive layer and the semiconductor device can be electrically connected together through a wire. Using the conductive layer as a relay point allows for reducing the length of each wire, so that the occurrence of breakage in wires can be reduced. In addition, by appropriately setting the area dimension of the conductive layer, handling of connection to an external electrode can be improved. In the case in which, for example, a semiconductor laser device is used as the semiconductor device, a plurality of wires can be easily disposed and connected between the semiconductor laser device and the conductive layer, and therefore, a current can be uniformly injected into the semiconductor device.

An example configuration of a light-emitting device as a semiconductor device including a composite substrate produced in an embodiment of the present disclosure will be described below.

Figure 22:
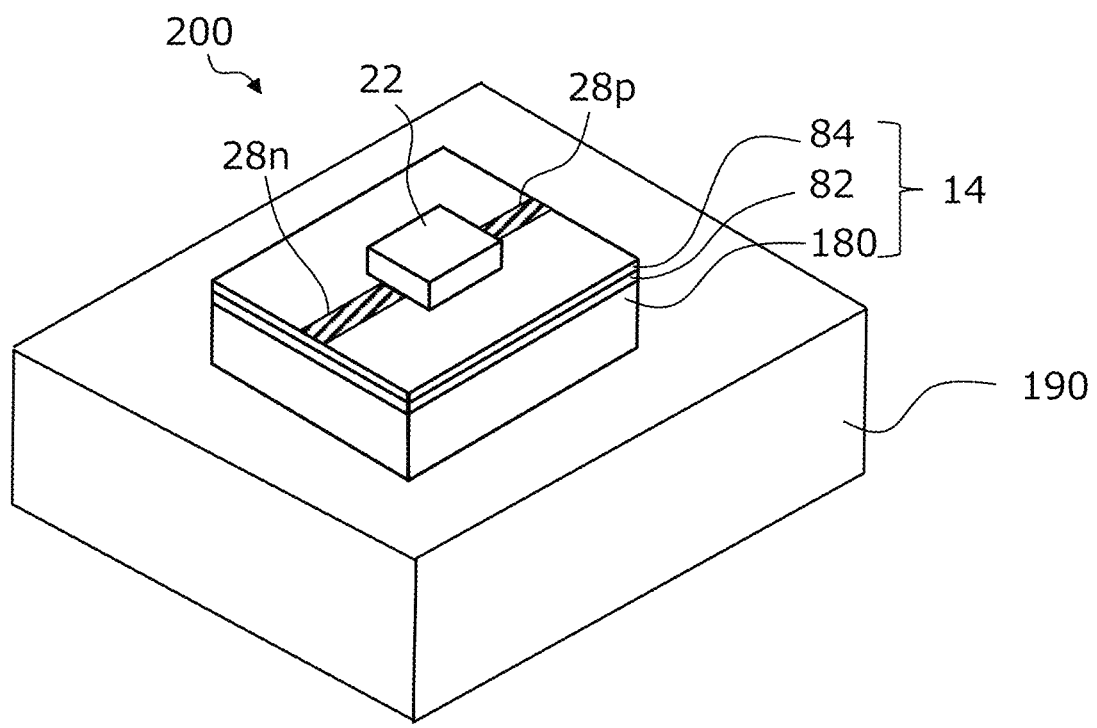
FIG. 22 is a perspective view schematically showing an example of a semiconductor device according to the present disclosure.

FIG. 22 is a perspective view schematically showing a light-emitting device 200 including a light-emitting diode (LED) device 22, and a composite substrate 14 supporting the LED element 22. The composite substrate 14 includes a base layer 180, a flat layer 82, and an insulating layer 84, and is fabricated by the method of producing in the embodiment described above. The insulating layer 84 is formed of, for example, AlN, which is a ceramic. A positive interconnect 28p and a negative interconnect 28n are formed on the insulating layer 84, and are electrically connected to a positive electrode and a negative electrode, respectively, of the LED element 22. A lower surface of the composite substrate 14 is in thermal contact with a heat sink 190. Heat generated in the LED 22 during operation is spread in in-plane directions by the insulating layer 84, and thereafter, dissipates to the outside through the base layer 180.

Figure 23:
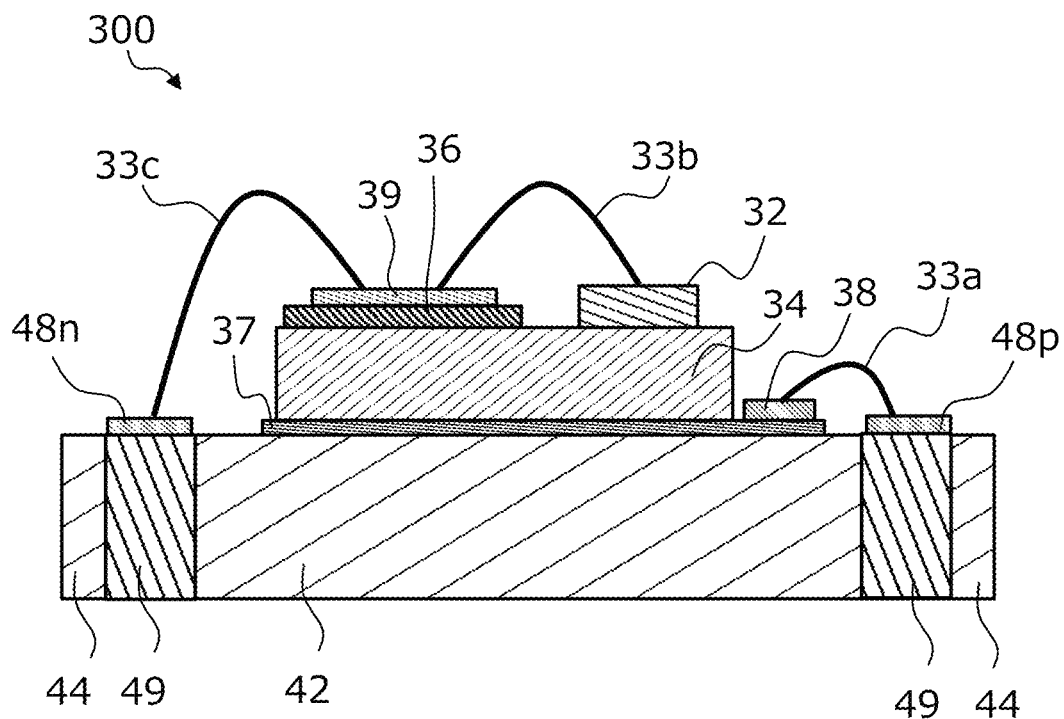
FIG. 23 is a cross-sectional view showing another example of a semiconductor device according to the present disclosure.

FIG. 23 is a cross-sectional view schematically showing an example configuration of a light-emitting device 300 including a laser diode (LD) element 32, a submount 34 supporting the LD element 32, and a base body 42 supporting the submount 34. The submount 34 includes the base layer of the embodiments described above. The base body 42 may be formed of the same material for the submount 34, or alternatively, may be formed of other materials, such as a metal or ceramic. A conductive layer 37 is disposed on an upper surface of the base body 42. The submount 34 is disposed on the conductive layer 37.

A portion of an upper surface of the submount 34 is covered by an insulating layer 36 of, for example, AlN, and a conductive surface of the submount 34 is exposed from the other portion of the upper surface. Thus, in an embodiment of the present disclosure, the upper surface of the composite substrate does not need to be entirely covered by the insulating layer 36. The insulating layer 36 is directly bonded to the submount 34 by a direct bonding technique described above. More specifically, the insulating layer 36 is directly bonded to a flat layer that defines the upper surface of the submount 34.

The base body 42 has a positive terminal 48p and a negative terminal 48n, which are electrically separated from the body by an insulating member 44. The insulating member 44 and the base body 42 are bonded together by a resin, solder, or the like, or by diffusion bonding. Each of the positive terminal 48p and the negative terminal 48n is electrically connected to a respective one of conductive vias 49 that vertically penetrate through the insulating member 44.

A positive electrode located on a lower surface of the LD element 32 is electrically connected to a conductive surface of the upper surface of the submount 34. The positive terminal 48p of the base body 42 is electrically connected through a wire 33a to a conductive layer 38 disposed on a conductive layer 37 located on the upper surface of the base body 42. With the submount 34 that is conductive, the positive terminal 48p is electrically connected to a positive electrode of the LD element 32 through the wire 33a, the conductive layer 38, the conductive layer 37, and the submount 34.

Meanwhile, a negative electrode located on an upper surface of the LD element 32 is electrically connected to a conductive layer 39 formed on the insulating layer 36 through a wire 33b. The conductive layer 39 is electrically connected to the negative terminal 48n through a wire 33c.

A lower surface of the base body 42 may be in thermal contact with a heat sink or cooling device. Heat generated in the LD element 32 during operation is spreads in in-plane directions by the submount 34, and thereafter, dissipates to the outside through the base body 42.

Figure 24:
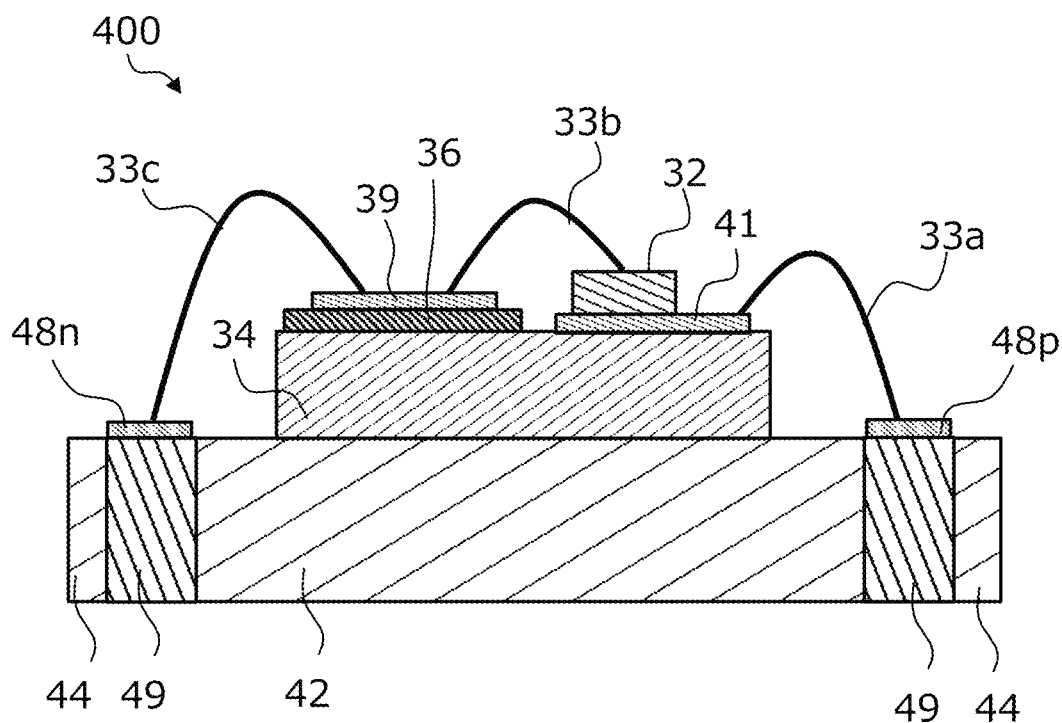
FIG. 24 is a cross-sectional view showing still another example of a semiconductor device according to the present disclosure.

FIG. 24 is a cross-sectional view showing an example configuration of a light-emitting device 400 that is another embodiment of the semiconductor device of the present disclosure. The light-emitting device 400 is mainly different from the light-emitting device 300 in that an Au layer 41 is disposed in an upper surface region of the submount 34 that is not covered by the insulating layer 36. With the Au layer 41 disposed in the upper surface region of the submount 34 not covered by the insulating layer 36, the wire 33a can be electrically connected through the Au layer 41 to a positive electrode of the LD element 32 on the submount 34. For example, the metal layer 92 of FIG. 5 can be used as the Au layer 41. More specifically, in the example configuration of the light-emitting device 400, the metal layer 92 has serves to directly bond the submount 34 and the insulating layer 36, and serves as a current path that electrically connects the wire 33a and the submount 34.

Figure 25:
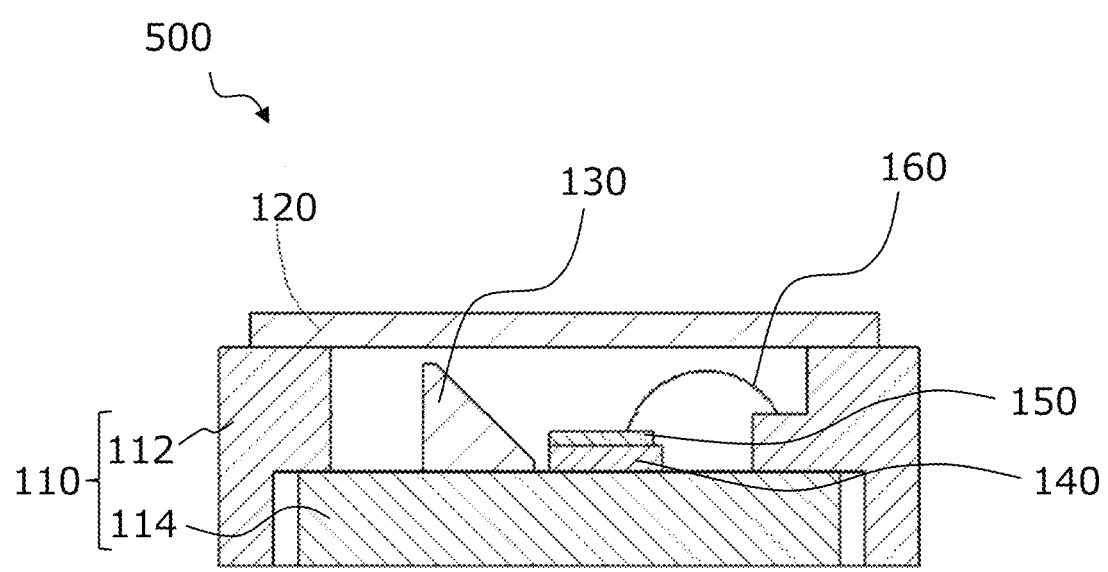
FIG. 25 is a cross-sectional view showing an example configuration of a light-emitting device that is another embodiment of a semiconductor device according to the present disclosure.

FIG. 25 is a cross-sectional view showing an example configuration of a light-emitting device 500 that is another embodiment of the semiconductor device of the present disclosure. The light-emitting device 500 has a base part 110, a cover part 120, a light reflection member 130, a submount 140, a semiconductor laser device 150, and a wire 160. The light reflection member 130, and the submount 140 on which the semiconductor laser device 150 is disposed, are disposed in a closed space of a package formed by bonding the base part 110 and the cover part 120 together. In the closed space of the package, the wire 160 electrically connected to the semiconductor laser device 150 disposed on the base part 110 is also provided. The cover part 120 may be formed of, for example, glass or sapphire having a metal film formed at a surface thereof. In particular, sapphire having a metal film disposed on a surface thereof is preferably used. Sapphire has a relatively high refractive index, and thus can reduce spreading of light. Also, because sapphire has relatively high strength and is less likely to be damaged, using sapphire allows for improving the air tightness of the closed space and the reliability of the light-emitting device 500.

As shown in FIG. 25, the base part 110 has a frame portion 112 and a bottom portion 114. The bottom portion 114 may be formed of the composite material of the present disclosure. Examples of the composite material include Cu-diamond, Ag-diamond, and Al-diamond. The frame portion 112 may be formed of a ceramic, such as alumina or AlN. Other materials may be used for the base part 110.

It is desirable that the bottom portion 114 is formed of a material that has a thermal conductivity higher than that of the frame portion 112. The bottom portion 114 and the frame portion 112 may be bonded together using a direct bonding technique. Direct bonding allows the base part 110 to have a high bonding strength. The bottom portion 114 formed of the composite material has a high thermal conductivity, and therefore, easily dissipates heat generated by operation of the semiconductor laser device 150. The light reflection member 130, which is disposed on the bottom portion 114 formed of the composite material, easily dissipates heat generated by the light reflection member.

The light-emitting devices 200, 300, 400, and 500 are examples of the semiconductor device including a heat dissipation substrate according to an embodiment of the present disclosure. The heat dissipation substrate can be used in various applications.

The composite substrate of the present disclosure is applicable as various heat dissipation substrates. Examples of the composite substrate include base bodies, submounts, heat spreaders, packages, and heat sinks, which are brought into thermal contact with devices such as semiconductor devices, semiconductor light emitting devices, semiconductor integrated circuit devices, and monolithic microwave integrated circuit devices.

While certain embodiments of the present invention have been described above, the present invention is not limited the described embodiments, and should be broadly construed on the basis of the claims. The present invention also encompasses variations and modifications that are made on the basis of the description above.

What is claimed is:

1. A composite substrate comprising:
    a base layer formed of a composite material containing diamond and a metal, the base layer having a first surface, and a second surface opposite to the first surface;
    a flat layer having a lower surface bonded to the first surface of the base layer, and an upper surface having a surface roughness Ra of 10 nm or less; and
    an insulating layer directly bonded to the upper surface of the flat layer.

2. The composite substrate according to claim 1, wherein: the flat layer contains one or more of Cu, Ag, Au, Al, CuW, CuMo, AlN, SiN, or $SiO_2$.

3. The composite substrate according to claim 1, wherein:
the flat layer is formed of a material having a coefficient of thermal expansion that is at least two times a coefficient of thermal expansion of the composite material.

4. The composite substrate according claim 1, wherein:
the flat layer has a thickness of 1000 μm or less.

5. The composite substrate according to claim 1, wherein:
the insulating layer has a thickness of 200 μm or less.

6. The composite substrate according to claim 1, wherein:
the flat layer comprises:
a metal layer having a lower surface bonded to the first surface, and
a metal member disposed on the metal layer and having a thickness greater than a surface roughness of the metal layer,
wherein the metal member forms the upper surface of the flat layer.

7. A semiconductor device comprising:
the composite substrate according to claim 1; and
a semiconductor device supported on the insulating layer of the composite substrate and electrically connected to the composite substrate.

* * * * *